(12) United States Patent
Soneda et al.

(10) Patent No.: US 9,316,672 B2
(45) Date of Patent: Apr. 19, 2016

(54) POWER STRIP AND POWER MEASUREMENT METHOD

(71) Applicants: FUJITSU LIMITED, Kawasaki-shi, Kanagawa (JP); FUJITSU COMPONENT LIMITED, Shinagawa-ku, Tokyo (JP)

(72) Inventors: Hiromitsu Soneda, Atsugi (JP); Osamu Tsuboi, Kawasaki (JP); Fumihiko Nakazawa, Kobe (JP); Naoyuki Nagao, Shinagawa (JP); Masakazu Hori, Shinagawa (JP)

(73) Assignees: FUJITSU LIMITED, Kawasaki (JP); FUJITSU COMPONENT LIMITED, Tokyo (JP)

( * ) Notice: Subject to any disclaimer, the term of this patent is extended or adjusted under 35 U.S.C. 154(b) by 181 days.

(21) Appl. No.: 13/955,503

(22) Filed: Jul. 31, 2013

(65) Prior Publication Data

US 2013/0317770 A1 Nov. 28, 2013

Related U.S. Application Data

(63) Continuation of application No. PCT/JP2011/052406, filed on Feb. 4, 2011.

(51) Int. Cl.
*G01R 21/133* (2006.01)
*H01R 13/66* (2006.01)
(Continued)

(52) U.S. Cl.
CPC .......... *G01R 21/1333* (2013.01); *G01R 21/133* (2013.01); *G08B 21/182* (2013.01);
(Continued)

(58) Field of Classification Search
CPC ........ Y02S 20/16; Y02S 20/242; G01R 21/08
See application file for complete search history.

(56) References Cited

U.S. PATENT DOCUMENTS 5,276,359 A * 1/1994 Chiang .......................... 327/514
5,764,523 A    6/1998 Yoshinaga
(Continued)

FOREIGN PATENT DOCUMENTS

JP    57026761 A * 2/1982
JP    S57-26761    2/1982
(Continued)

OTHER PUBLICATIONS

Texas Instruments, Single/Dual/Quad Channel Optocouplers Data Sheet, 1992.*

(Continued)

*Primary Examiner* — John Breene
*Assistant Examiner* — Christine Liao
(74) *Attorney, Agent, or Firm* — Kratz, Quintos & Hanson, LLP

(57) ABSTRACT

A power strip includes: a first power line; a second power line between which and the first power line a power supply voltage is applied; a jack portion; a current meter configured to measure a current being supplied to an external electrical device from the jack portion; a first photocoupler including a first light emitting diode connected between the first power line and the second power line and configured to output a first output signal whose level is changed when the power supply voltage exceeds a first threshold; and a computing unit configured to calculate a power value by using instantaneous values of the current measured by the current meter and instantaneous values of the power supply voltage estimated from the length of a period when the level of the first output signal is changed.

16 Claims, 29 Drawing Sheets

(51) Int. Cl.
  *H01R 25/00*   (2006.01)
  *G08B 21/18*   (2006.01)
  *H02J 13/00*   (2006.01)

(52) U.S. Cl.
  CPC .......... *H01R13/6683* (2013.01); *H01R 25/003* (2013.01); *H02J 13/0006* (2013.01); *Y02B 70/3266* (2013.01); *Y02B 90/226* (2013.01); *Y04S 20/16* (2013.01); *Y04S 20/242* (2013.01)

(56) References Cited

U.S. PATENT DOCUMENTS

| | | | | |
|---|---|---|---|---|
| 5,995,806 | A | * | 11/1999 | Tsubouchi et al. ............. 455/39 |
| 6,483,291 | B1 | * | 11/2002 | Bhateja et al. ................ 324/142 |
| 7,043,543 | B2 | * | 5/2006 | Ewing et al. ................ 709/223 |

FOREIGN PATENT DOCUMENTS

| | | | |
|---|---|---|---|
| JP | 04006477 | A * | 1/1992 |
| JP | H4-6477 | | 1/1992 |
| JP | H6-258362 | | 9/1994 |
| JP | H9-189723 | | 7/1997 |
| JP | 2001-228183 | A1 | 8/2001 |
| JP | 3418582 | B2 | 6/2003 |
| JP | 2008-261826 | A1 | 10/2008 |

OTHER PUBLICATIONS

Alferink, Freddy, Voltage, Current, Power & Energy: Definitions:: Electronic Measurements, http://www.meettechniek.infor/measurement/theory-definitions.html (available Apr. 10, 2009).*
Digilent, AC Power Analysis, www.digilentinc.com, Dec. 13, 2010.*
Marshall, Dave, Nyquist's Sampling Theorem, https://www.cs.cf.ac.uk/Dave/Multimedia/node149.html, Oct. 4, 2001.*
Wolfe, Joe, AC Circuits: Alternating Current Electricity, http://www.animations.physics.unsw.edu.au/jw/AC.html, (Jul. 26, 2010).*
Tamura-Europe Ltd, Hall Effect Current Sensors, http://www.tamura-europe.co.uk/sites/pro/hal.html, (Apr. 20, 2009).*
International Search Report for International Application No. PCT/JP2011/052406 dated May 10, 2011.
CN Office Action dated Oct. 20, 2014. Application No. 201180066783.8.

* cited by examiner

POWER STRIP AND POWER MEASUREMENT METHOD

CROSS-REFERENCE TO RELATED APPLICATION

This application is a continuation of International Patent Application No. PCT/JP2011/052406 filed Feb. 4, 2011 and designated the U.S., the entire contents of which are incorporated herein by reference.

FIELD

The embodiments discussed herein are related to a power strip and a power measurement method.

BACKGROUND

In recent years, saving of power consumption at home and office has been gaining momentum along with an increase in power demand and concerns about global environment. With the growing consciousness of energy saving, people make efforts to turn off the power supplies of electrical devices frequently, to revise the preset temperature of air conditioning, and to do the like.

In order to know how much energy is actually saved as a result of these efforts, there is a method using power meters provided to respective households.

However, the power meter for each household is provided to a power switchboard installed at a stage before the distribution of power to the inside of the house, and is not capable of measuring power consumption of each electrical device at home or office.

Moreover, power is usually distributed to a plurality of electrical devices via a power strip connected to a wall outlet at home or office. The commercially available power strip, however, does not have a function to individually measure the power consumption of each electrical device.

The power consumption may be measured by a voltage measurement device electrically connected to the power line. This method, however, has a problem that, when a surge occurs in the power line, the voltage measurement device connected to the power line may be broken due to a flow of excessive current into the voltage measurement device. In addition, it is preferable to calculate the power consumption as accurately as possible.

PATENT DOCUMENT 1: Japanese Laid-open Patent Publication No. 04-6477
PATENT DOCUMENT 2: Japanese Laid-open Patent Publication No. 57-26761

SUMMARY

According to an aspect of the following disclosure, there is provided a power strip including: a first power line; a second power line between which and the first power line a power supply voltage is applied; a jack portion; a current meter configured to measure a current being supplied to an external electric device from the jack portion; a first photocoupler including a first light emitting diode electrically connected between the first power line and the second power line, the first photocoupler configured to output a first output signal whose level is changed when the power supply voltage exceeds a first threshold; and a computing unit configured to calculate a power value by using instantaneous values of the current measured by the current meter and instantaneous values of the power supply voltage estimated from the length of a period when the level of the first output signal is changed.

In addition, according to another aspect of the disclosure, there is provided a power measurement method including: applying a power supply voltage supplied to a power strip to both ends of a first light emitting diode included in a first photocoupler; monitoring a first output signal of the first photocoupler, a level of the first output signal being changed when the power supply voltage exceeds a first threshold, and thereby obtaining the length of a period when the level of the first output signal is changed; estimating instantaneous values of the power supply voltage from the length of the period; measuring instantaneous values of a current for each of a plurality of jack portions included in the power strip, the current being supplied to an external electrical device from the jack portion; and calculating a power value of each of the plurality of jack portions individually by using the instantaneous values of the power supply voltage and the instantaneous values of the current.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS (First Embodiment)

Figure 1:
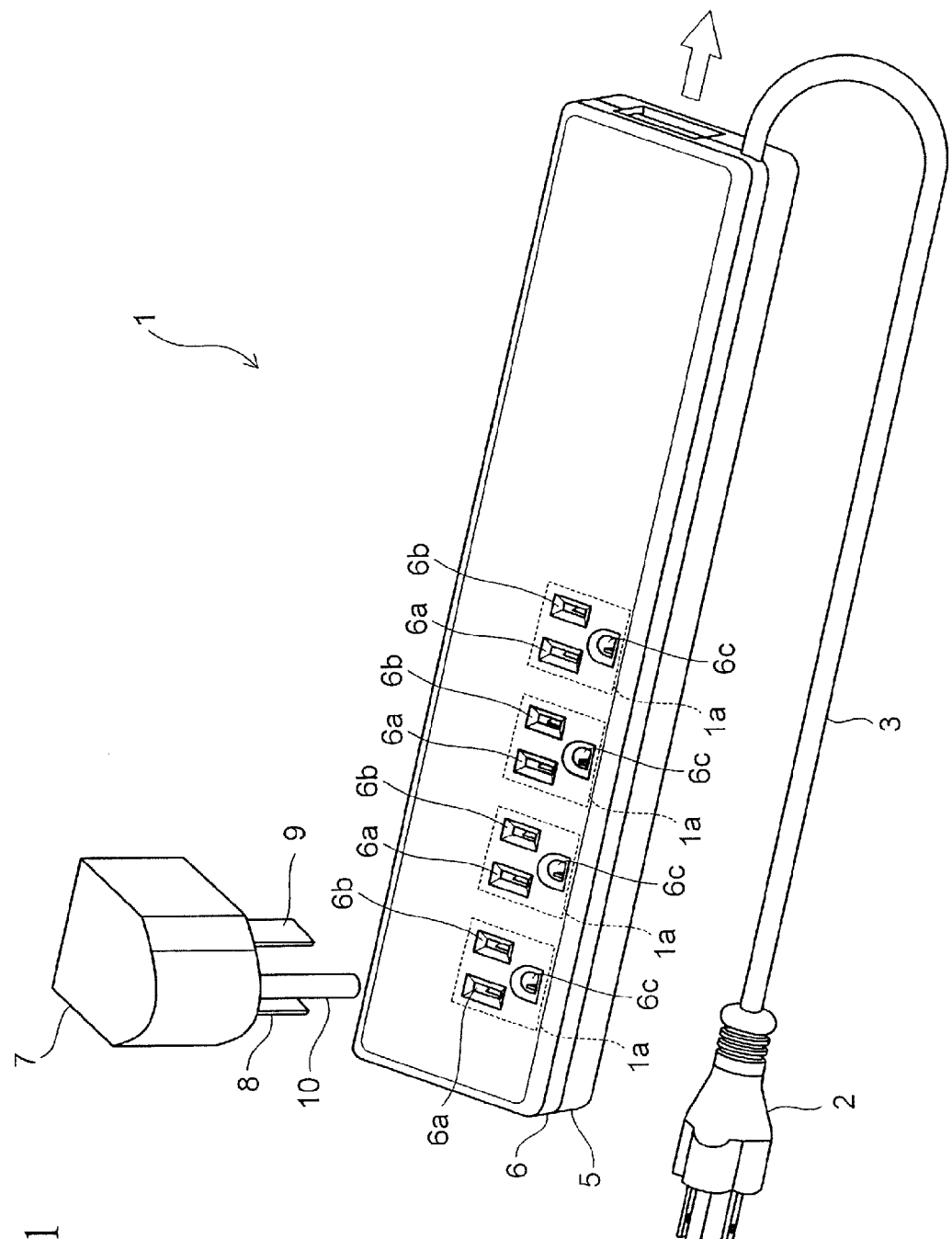
FIG. 1 is an external view of a power strip according to a first embodiment.

FIG. 1 is an external view of a power strip 1 according to this embodiment.

This power strip 1 includes a plug 2, a power cord 3, a lower casing 5, and an upper casing 6.

Among them, the upper casing 6 is provided with a plurality of jack portions 1*a* each corresponding to a plug 7. The plug 7 is provided to an external electrical device and includes a first plug blade 8, a second plug blade 9, and an earth terminal 10.

Each of the above jack portions 1*a* is provided with a first insertion port 6*a* into which the first plug blade 8 is to be inserted, a second insertion port 6*b* into which the second plug blade 9 is to be inserted, and a third insertion port 6*c* into which the earth terminal 10 is to be inserted.

In the above-described power strip 1, the plug 2 is inserted into an electric outlet installed in a wall surface or the like, and thereby a power supply voltage of the installed electric outlet is supplied to each of the jack portions 1*a*.

Figure 2:
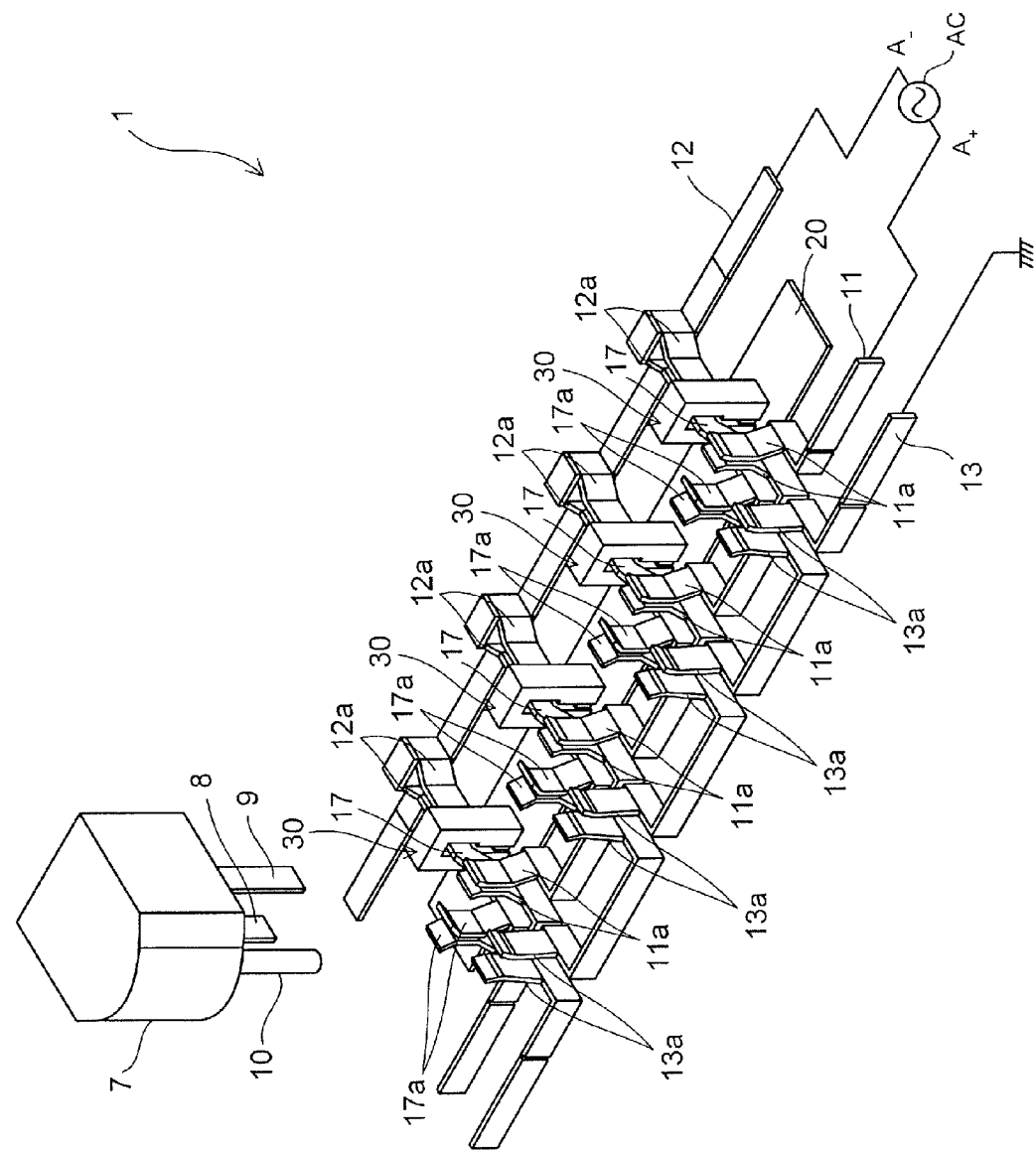
FIG. 2 is an external view of the power strip according to the first embodiment with its casings removed.

FIG. 2 is an external view of the power strip 1 with the casings 5 and 6 removed.

As illustrated in FIG. 2, the power strip 1 is provided with first to third bus bars 11 to 13. These bus bars 11 to 13 are each fabricated by die-cutting a metal plate such as a brass plate and then bending it, for example.

Among the bus bars 11 to 13, the first bus bar 11 and the second bus bar 12 serve as a first power line and a second power line, respectively, and are electrically connected to two electrodes $A_+$, $A_-$ of an AC power supply AC, respectively, via the power cord 3 (see FIG. 1). The third bus bar 13 is maintained at an earth potential via the power cord 3.

In addition, the first bus bar 11 includes a plurality of first contacts 11*a* to receive the second plug blades 9 of plugs 7.

On the other hand, the second bus bar 12 includes nipping pieces 12*a* arranged at constant intervals in an extending direction of the second bus bar 12.

Each of the nipping pieces 12*a* nips a branch bar 17 and a pair of second contacts 17*a* are provided at an end portion of the branch bar 17.

The second contacts 17*a* are paired with the foregoing first contacts 11*a*, and receive the first plug blades 8 of the plugs 7.

Then, the third bus bar 13 includes a plurality of third contacts 13*a* to receive the earth terminals 10 of the plugs 7.

A first circuit board 20 is provided under the branch bars 17.

The first circuit board 20 is provided with current meters 30 each configured to measure an electric current being supplied from the branch bar 17 to the corresponding plug 7.

Figure 3:
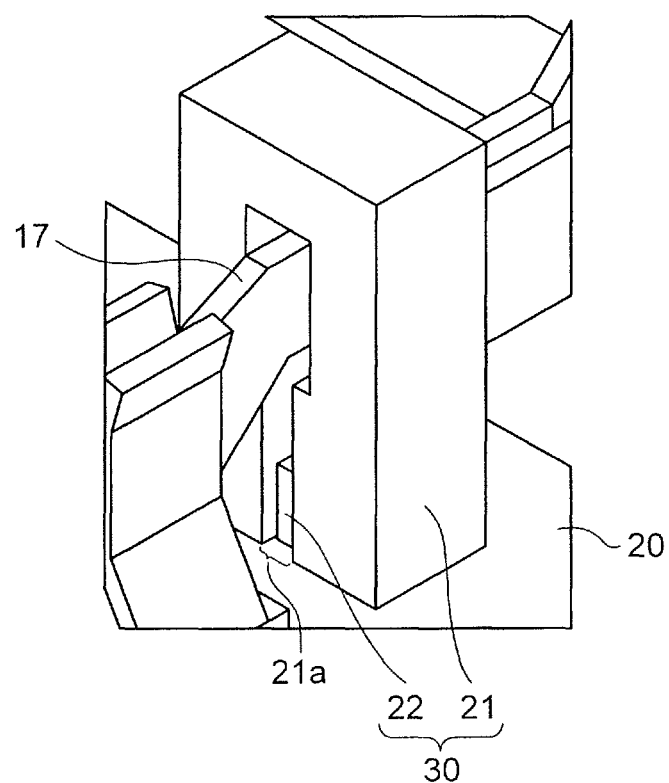
FIG. 3 is an enlarged perspective view of a current meter included in the power strip according to the first embodiment and the vicinity thereof.

FIG. 3 is an enlarged perspective view of the current meter 30 and the vicinity thereof.

The current meter 30 includes a magnetic core 21 fixedly attached to the first circuit board 20 corresponding to each of the branch bars 17. The magnetic core 21 is formed to confine therein a magnetic field generated around the current flowing through the branch bar 17, and is formed in an almost ring shape along the flux of the magnetic field. A material for the magnetic core 21 is not particularly limited, and easily available ferrites are used in this embodiment.

Moreover, the current meter 30 includes a hall element 22 in a gap 21*a* of the magnetic core 21. The hall element 22 is used to measure instantaneous values I(t) of the current flowing through the branch bar 17 on the basis of the intensity of the magnetic field in the gap 21*a*, and is mounted on the first circuit board 20 by soldering or the like.

Since the current meter 30 may be fabricated by attaching the magnetic core 21 and the hall element 22 to the first circuit board 20 as described above, it may be possible to suppress increases in the number of components and assembling costs for the power strip 1.

Figure 4:
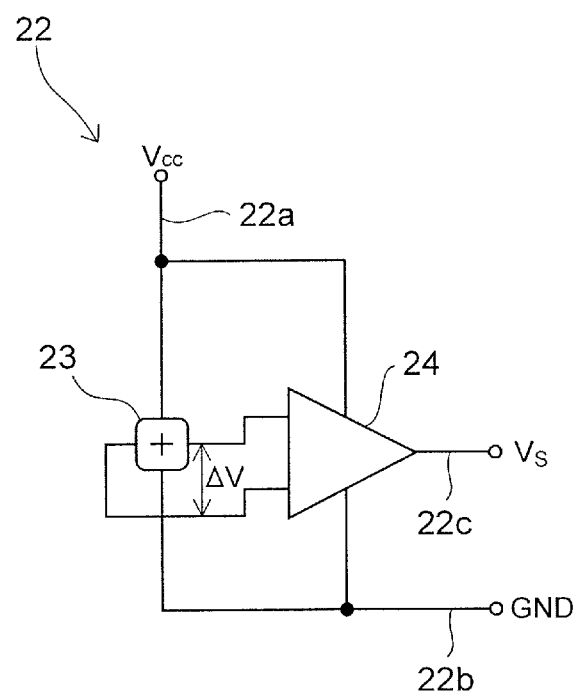
FIG. 4 is a circuit diagram of a hall element included in the power strip according to the first embodiment.

FIG. 4 is a circuit diagram of the hall element 22.

As illustrated in FIG. 4, the hall element 22 includes a gallium arsenide-based magnetic sensing unit 23 and a differential amplifier 24.

When the magnetic sensing unit 23 is exposed to a magnetic field with a voltage Vcc applied to a portion between a power supply terminal 22*a* and an earth terminal 22*b*, the magnetic sensing unit 23 generates a potential difference ΔV depending on the intensity of the magnetic field. The potential difference ΔV is amplified by the differential amplifier 24, and then is outputted as a current sensor voltage $V_s$ from an output terminal 22*c* to the outside.

Figure 5:
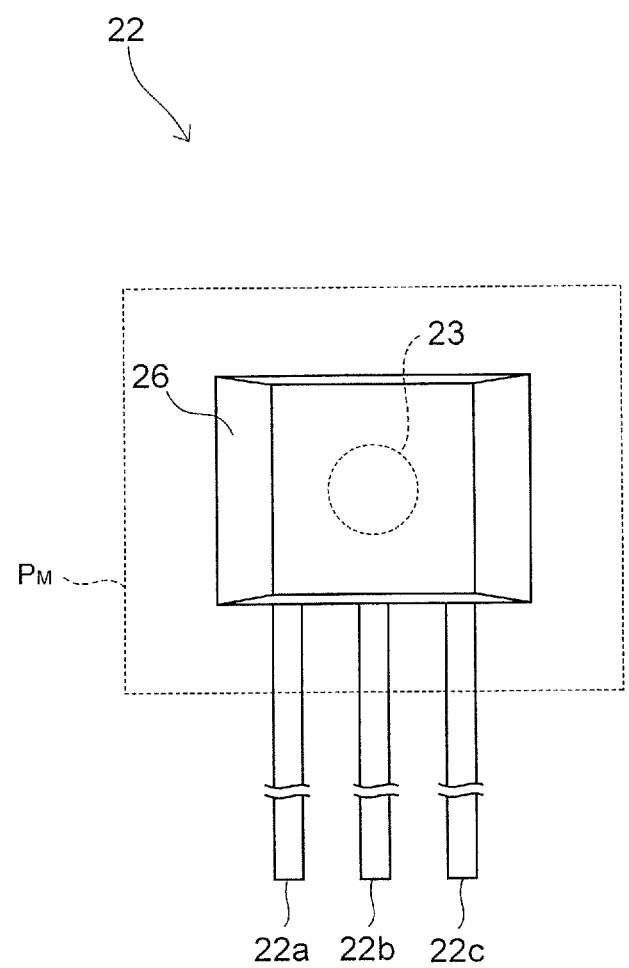
FIG. 5 is a plan view of the hall element included in the power strip according to the first embodiment.

FIG. 5 is a plan view of the hall element 22.

As illustrated in FIG. 5, the magnetic sensing unit 23 is sealed by a resin 26 so as to be located within a magnetic sensing plane $P_M$. The hall element 22 detects a magnetic-field component perpendicular to the magnetic sensing plane $P_M$ from the magnetic field passing through the magnetic sensing unit 23 and outputs the current sensor voltage $V_s$ corresponding to the intensity of the component from the aforementioned output terminal 22*c*.

The terminals 22*a* to 22*c* are electrically connected to wirings inside the first circuit board 20 (see FIG. 3) by soldering or the like.

The forgoing hall element 22 is smaller in element size than other magnetic field measurement elements such as a current transformer, and is unlikely to lead to a size increase of a power strip.

Moreover, the current transformer measures the intensity of a magnetic field by using an induced current generated along with a change of the magnetic field over time, and therefore the measurement target of the current transformer is limited to an alternating magnetic field. In contrast, the hall element 22 has an advantage in that it may measure the intensity of a static magnetic field.

In addition, the hall element 22 is less expensive than the current transformer, and thereby may prevent the costs for the power strip from becoming high.

Figure 6:
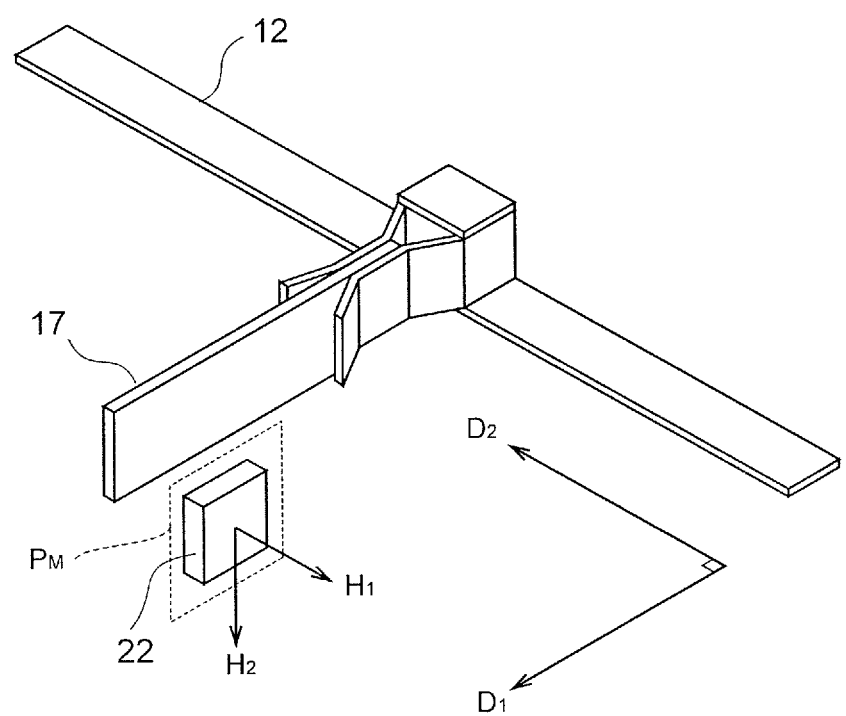
FIG. 6 is a perspective view for explaining a positional relationship between the magnetic sensing plane of the hall element and a branch bar according to the first embodiment.

FIG. 6 is a perspective view for explaining a positional relationship between the magnetic sensing plane $P_M$ of the hall element 22 and the branch bar 17.

The magnetic sensing plane $P_M$ is set in parallel with an extending direction $D_1$ of the branch bar 17. With this setting, a magnetic field $H_1$ generated from the current passing through the branch bar 17 passes through the magnetic sensing plane $P_M$ at substantially right angles, and thereby the current detection sensitivity of the hall element 22 is enhanced.

In addition, in this embodiment, the extending direction $D_1$ of the branch bar 17 is set in non-parallel with an extending direction $D_2$ of the second bus bar 12, and thereby a magnetic field $H_2$ generated in the second bus bar 12 does not pass through the magnetic sensing plane $P_M$ at right angles. Thus, it may be possible to lower a risk that the hall element 22 provided to measure the magnetic field $H_1$ generated in the branch bar 17 may erroneously detect the magnetic field $H_2$ generated in the second bus bar 12. This may prevent crosstalk in which the magnetic field detection result of the hall element 22 contains influence of a magnetic field other than $H_1$, and improves the measurement accuracy of the magnetic field $H_1$ by the hall element 22.

When the extending direction $D_1$ of the branch bar 17 is set to be perpendicular to the extending direction $D_2$ of the second bus bar 12 in particular, the magnetic sensing plane $P_M$ is also perpendicular to the extending direction $D_2$. For this reason, the magnetic field $H_2$ generated in the second bus bar 12 does not have a magnetic-field component perpendicular to the magnetic sensing plane $P_M$, and thereby the risk that the hall element 22 may erroneously detect the magnetic field $H_2$ may be further reduced.

Figure 7:
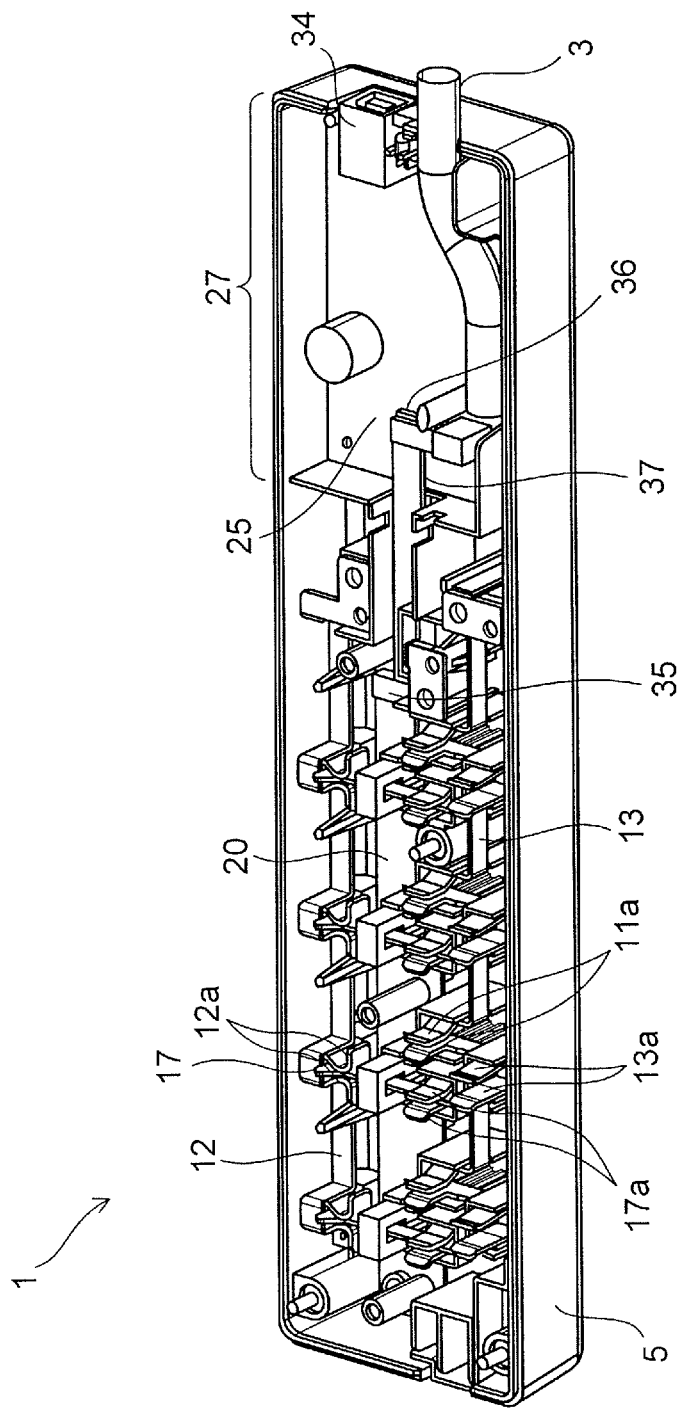
FIG. 7 is an external view of the power strip according to the first embodiment with its upper casing removed.

FIG. 7 is an external view of the power strip 1 with the upper casing 6 removed.

As illustrated in FIG. 7, the lower casing 5 is partitioned to have a transmitter circuit section 27 in which a second circuit board 25 is housed.

The first circuit board 20 and the second circuit board 25 are provided with connectors 35, 36, respectively, and a communication cable 37 is connected to these connectors 35, 36.

The communication cable 37 has functions such as: supplying the first circuit board 20 with electric power taken in from the power cord 3 and needed to drive the hall elements 22 (see FIG. 3); and transmitting an output signal of each of the hall elements 22 to the second circuit board 25.

Figure 8:
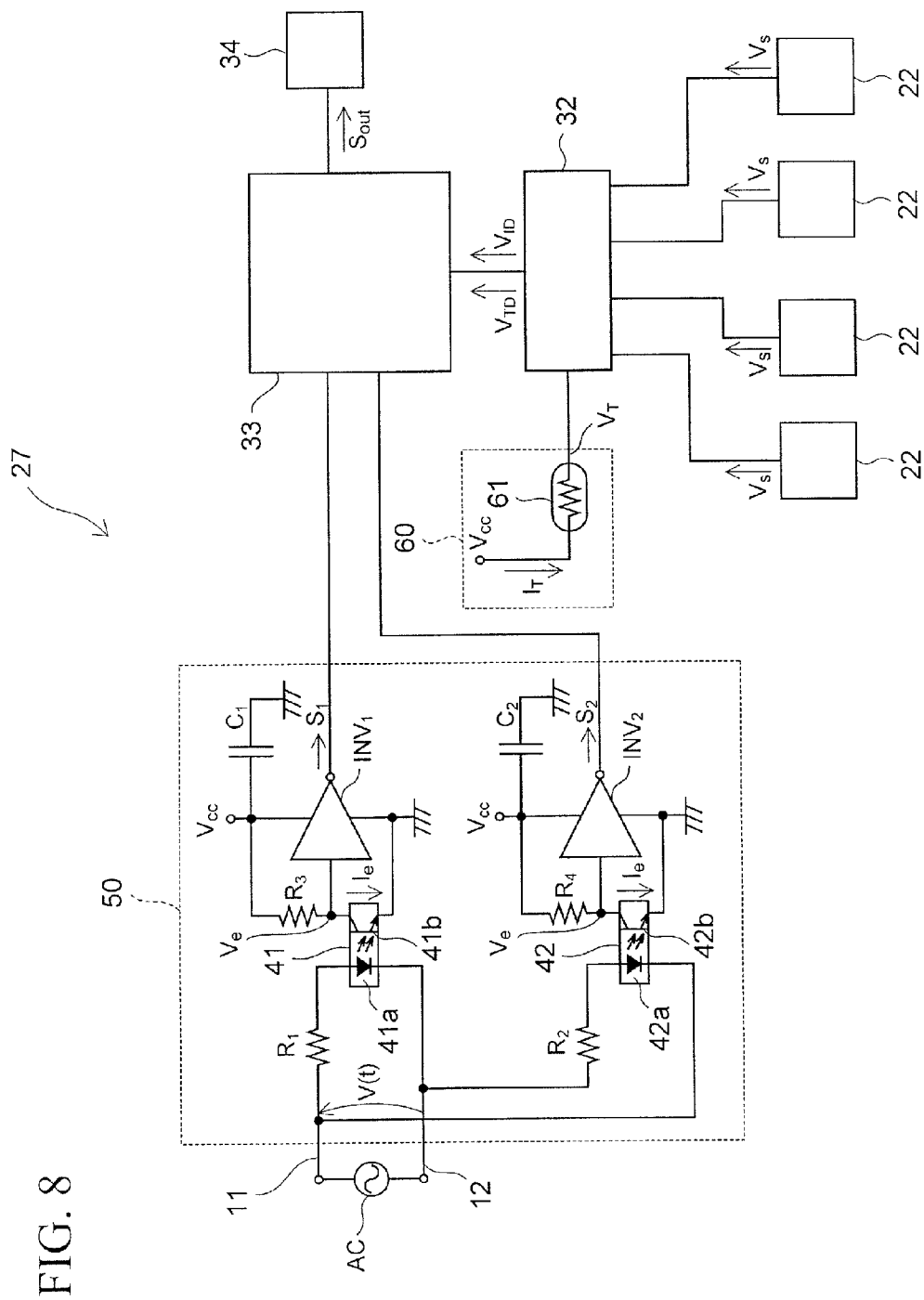
FIG. 8 is a functional block diagram of a transmitter circuit section included in the power strip according to the first embodiment.

FIG. 8 is a functional block diagram of the transmitter circuit section 27.

As illustrated in FIG. 8, the transmitter circuit section 27 includes an AD convertor 32, a computing unit 33, an output port 34, a voltage measuring unit 50, and a temperature measuring unit 60.

Among them, the AD convertor 32 generates a digital current signal $V_{ID}$ by digitizing the current sensor voltage $V_s$ with analog values outputted from each of the hall elements 22, and then outputs the digital current signal $V_{ID}$ to the computing unit 33.

The computing unit 33 is, for example, an MPU (Micro Processing Unit), and calculates power consumption values of the respective jack portions 1a as described later. The calculation result is outputted as output data $S_{out}$ from the computing unit 33 and then is outputted to the outside via the output port 34 electrically connected to the computing unit 33.

The temperature measuring unit 60 measures the ambient temperature of the voltage measuring unit 50, and includes a thermistor 61 having one end to which a voltage Vcc is applied. When the voltage Vcc is applied, a temperature sensor current $I_T$ flows through the thermistor 61. The magnitude of the temperature sensor current $I_T$ varies depending on the ambient temperature, and a temperature sensor voltage $V_T$ appearing at the other end of the thermistor 61 also varies. The ambient temperature may be detected by monitoring the temperature sensor voltage $V_T$.

The temperature sensor voltage $V_T$ is digitalized by the AD converter 32 and is outputted therefrom as a digital temperature signal $V_{TD}$ to the computing unit 33.

On the other hand, the voltage measuring unit 50 includes a first photocoupler 41, a second photocoupler 42, a first inverter $INV_1$, and a second inverter $INV_2$.

Among them, the first photocoupler 41 includes a first light emitting diode 41a and a first photo transistor 41b to receive light from the first light emitting diode 41a. A cathode of the first light emitting diode 41a is electrically connected to the second bus bar 12. An anode of the first light emitting diode 41a is electrically connected to the first bus bar 11 via a first resistor $R_1$.

The first resistor $R_1$ functions to prevent an excessive current from flowing into the first light emitting diode 41a from each of the bus bars 11, 12.

A voltage Vcc is applied to an emitter of the first photo transistor 41b via a third resistor $R_3$, and a collector of the first photo transistor 41b is maintained at an earth voltage.

An emitter current $I_e$ flows between the emitter and the collector. An amount of voltage drop at the third resistor $R_3$ varies depending on the magnitude of the emitter current $I_e$, and accordingly the emitter voltage $V_e$ varies.

For example, when the first photocoupler 41 is in the OFF state, the first photo transistor 41b is in the OFF state. Thus, the emitter current $I_e$ does not flow into the third resistor $R_3$ and the emitter voltage $V_e$ becomes at the high level that is the same as the voltage Vcc.

On the other hand, when the first photocoupler 41 is in the ON state, the first photocoupler 41b is in the ON state. Thus, the emitter current $I_e$ flows into the third resistor $R_3$, and the emitter voltage $V_e$ becomes lower than the voltage Vcc by the amount of voltage drop at the third resistor $R_3$, and thereby becomes at the low level.

The emitter voltage $V_e$ thus varying is turned into a first output signal $S_1$ in such a way that the voltage level of the emitter voltage $V_e$ is inverted by the first inverter $INV_1$ at the following stage.

Here, the first photocoupler 41 is set to become in the ON state when a forward voltage applied to the first light emitting diode 41a exceeds a positive first threshold $V_1$. For this reason, whether or not an instantaneous value V(t) of the power supply voltage between the bus bars 11, 12 exceeds the first threshold $V_1$ may be judged by monitoring the voltage level of the first output signal $S_1$.

Here, the first inverter $INV_1$ drives between the voltage Vcc and the earth potential. One of electrodes of a first capacitor $C_1$ is connected to an input node of the voltage Vcc, and thereby the voltage Vcc inputted to the first inverter $INV_1$ is stabilized.

On the other hand, the second photocoupler 42 includes a second light emitting diode 42a and a second photo transistor 42b to receive light from the second light emitting diode 42a. A cathode of the second light emitting diode 42a is electrically connected to the first bus bar 11. An anode of the second light emitting diode 42a is electrically connected to the second bus bar 12 via a second resistor $R_2$.

The second photocoupler 42 and the second inverter $INV_2$ at the following stage have functions similar to the foregoing functions of the first photocoupler 41 and the first inverter $INV_1$.

For example, when the second photocoupler 42 is in the OFF state, the emitter voltage $V_e$ becomes at the high level as in the voltage Vcc, and a voltage at the low level obtained by inverting the emitter voltage $V_e$ is outputted as a second output signal $S_2$ from a second inverter $INV_2$.

On the other hand, when the second photocoupler 42 is in the ON state, the emitter voltage $V_e$ becomes lower than the voltage Vcc due to a voltage drop at a fourth resistor $R_4$, and thereby the second output signal $S_2$ becomes at the high level.

Here, in the second inverter $INV_2$, the voltage Vcc is stabilized by a second capacitor provided to an input node of the voltage Vcc. In addition, a second resistor $R_2$ is provided at the previous stage of the second photocoupler 42, whereby an excessive current may be prevented from flowing into the second light emitting diode 42a from the bus bars 11, 12.

The foregoing second photocoupler 42 is set to become in the ON state when a forward voltage applied to the second light emitting diode 42a exceeds a positive second threshold $V_2$. For this reason, whether or not an instantaneous value V(t) of the power supply voltage between the bus bars 11, 12 exceeds the second threshold $V_2$ may judged by monitoring the voltage level of the second output signal $S_2$.

Moreover, in this embodiment, the light emitting diodes 41a, 42a are electrically connected to the bus bar 11, 12 with the polarities of the diodes 41a, 42a reversed from each other. Thus, the instantaneous values V(t) on the positive side are monitored by the first light emitting diode 41a and the instantaneous values V(t) on the negative side are monitored by the second light emitting diode 42a.

In addition, the input side and the output side of the first photocoupler 41 are electrically isolated from each other. Thus, even when the instantaneous values V(t) largely vary due to a surge, there is a low risk that the first photo transistor 41b on the output side may be broken. For the same reason, there is also a low risk that the second photocoupler 42 may be broken due to a surge.

In this way, the surge resistance of the voltage measuring unit 50 may be enhanced in this embodiment.

Next, the detailed operation of the foregoing transmitter circuit section 27 is described.

Figure 9:
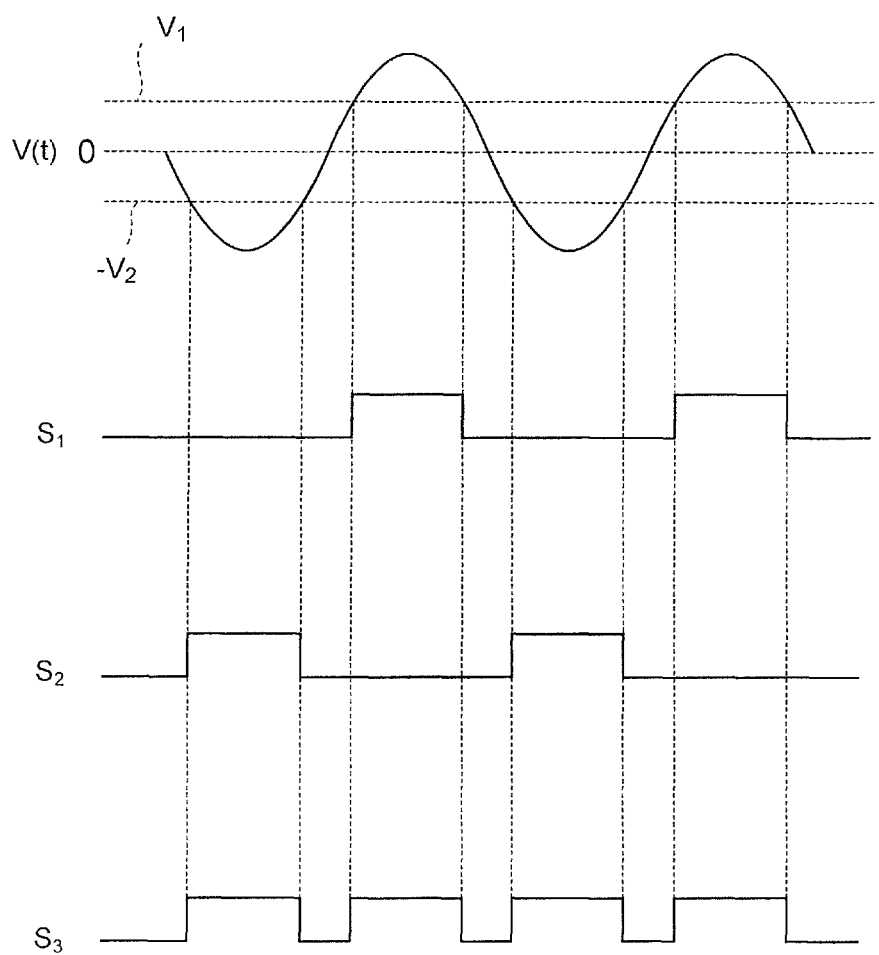
FIG. 9 is a timing chart of a first output signal, a second output signal, and instantaneous values of a power supply voltage.

FIG. 9 is a timing chart of the first output signal $S_1$, the second output signal $S_2$, and the instantaneous values V(t) of the power supply voltage described above. Here, FIG. 9 also presents a composite signal $S_3$ obtained by synthesizing the first output signal $S_1$ and the second output signal $S_2$.

In addition, the power supply voltage V(t) is defined as 0 when the potentials of the first bus bar 11 and the second bus bar 12 are equal to each other, and as positive when the potential of the first bus bar 11 is higher than that of the second bus bar 12.

As illustrated in FIG. 9, the first output signal $S_1$ is at the high level while the instantaneous values V(t) of the power supply voltage exceed the first threshold $V_1$.

On the other hand, the second output signal $S_2$ is at the high level while the instantaneous values V(t) are lower than the second threshold $V_2$.

With the above settings, the computing unit 33 may recognize that the instantaneous value V(t) is on the positive side when the first output signal $S_1$ is at the high level, and that the instantaneous value V(t) is on the negative side when the second output signal $S_2$ is at the high level.

Moreover, when any one of the output signals $S_1$, $S_2$ is always at the low level, the computing unit 33 may recognize that the instantaneous values V(t) are always on either one of the positive side and the negative side. Thus, the computing unit 33 may determine that the power supply voltage is a direct-current voltage supplied from solar cells or a direct-current distribution facility.

Meanwhile, the composite signal $S_3$ obtained by synthesizing the output signals $S_1$, $S_2$ is at the low level while both the signals $S_1$, $S_2$ are at the low level.

The computing unit 33 estimates the value of each instantaneous value V(t) in the following way using such characteristics of the signals $S_1$, $S_2$.

Figure 10:
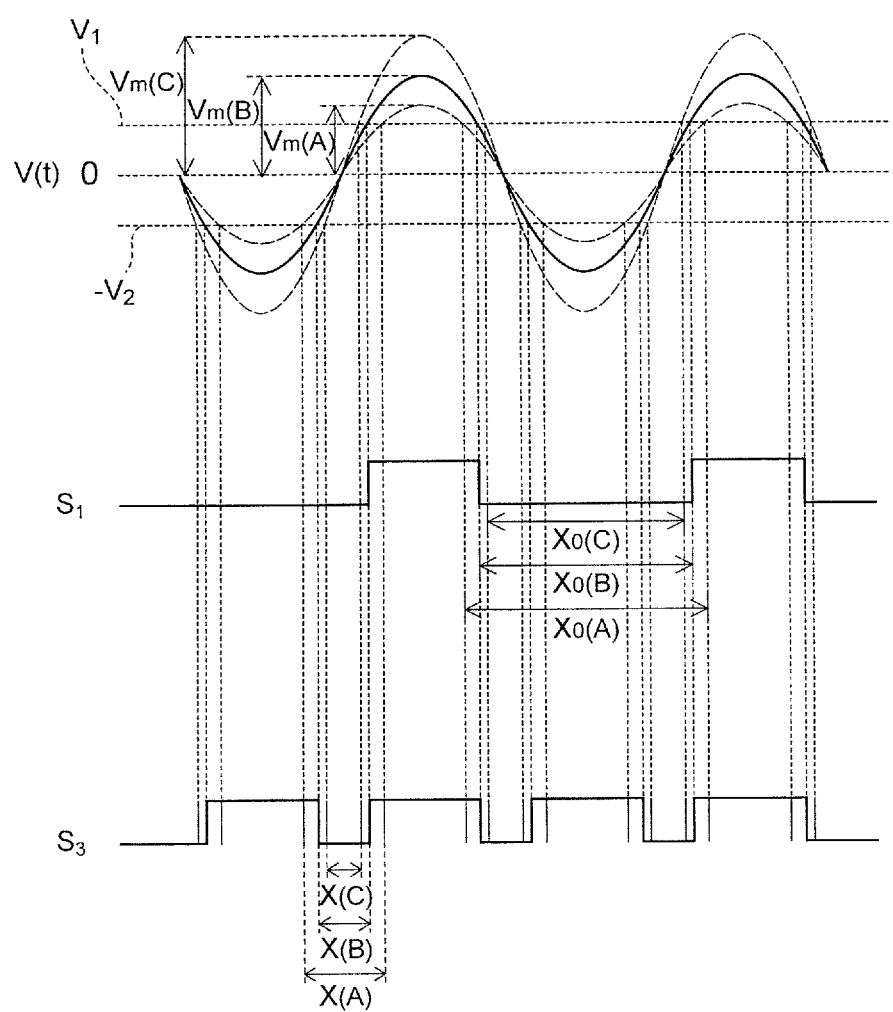
FIG. 10 is a timing chart of a composite signal of the first output signal and the second output signal and the instantaneous values of the power supply voltage.

FIG. 10 is a timing chart of the instantaneous values V(t) and the composite signal $S_3$ in the power strip 1 in actual use.

As illustrated in FIG. 10, the peak value $V_m$ of the instantaneous values V(t) varies as presented by $V_m(A)$, $V_m(B)$, $V_m(c)$ in actual use due to a load of an external device connected to each of the jack portions 1a (see FIG. 1).

When the peak value varies, the timing at which the instantaneous values V(t) exceed each of the thresholds $V_1$, $V_2$ varies and accordingly the length X of a period in which the composite signal $S_3$ is at the low level also varies as presented by X(A), X(B), X(C).

Thus, the above length X of the period may be used as an indication for estimating the peak value $V_m$ and an effective voltage value $V_{rms}$ of the power supply voltage.

In this embodiment, provided that the length X of the period and the effective voltage value $V_{rms}$ of the power supply voltage have a linear relationship, the effective voltage value $V_{rms}$ is estimated by using the following formula (1):
[Formula 1]

$$V_{rms}=aX+b \qquad (1).$$

In the formula (1), a and b are constants experimentally determined in advance.

When the effective voltage value $V_{rms}$ is calculated as described above, the instantaneous values V(t) of the power supply voltage may be calculated as in the following formula (2):
[Formula 2]

$$V(t)=\sqrt{2}V_{rms}\sin(\omega t)=\sqrt{2}(aX+b)\sin(\omega t) \qquad (2).$$

In the formula (2), $\omega$ is an angular frequency of the power supply voltage and a usable value thereof is a value determined in a region where the power strip 1 is used.

In the above description, the length X of the period when the composite signal $S_3$ is at the low level is used to calculate the effective voltage value $V_{rms}$ (formula 1) and the instantaneous values V(t) (formula 2). However, this embodiment is not limited to this.

For example, as illustrated in FIG. 10, when the peak value $V_m$ varies, the length $X_0$ of a period when the first output signal $S_1$ is at the low level also varies as presented by $X_0(A)$, $X_0(B)$, $X_0(C)$. Hence, the length $X_0$ may be used to estimate the effective voltage value $V_{rms}$ and the instantaneous values V(t).

In this case, provided that the length $X_0$ of the period and the effective voltage value $V_{rms}$ of the power supply voltage have a linear relationship, the effective voltage value $V_{rms}$ may be estimated by using the following formula (3):
[Formula 3]

$$V_{rms}=\alpha X_0+\beta \qquad (3).$$

In the formula (3), $\alpha$ and $\beta$ are constants experimentally determined in advance.

By substituting the formula (3) into the middle side of the formula (2), the instantaneous values V(t) may be estimated as in the following formula (4):
[Formula 4]

$$V(t)=\sqrt{2}V_{rms}\sin(\omega t)=\sqrt{2}(\alpha X_0+\beta)\sin(\omega t) \quad (4).$$

In this embodiment, the instantaneous values V(t) are obtained as in the formula (2) or the formula (4), and are used to calculate a power value as described later. The instantaneous values V(t) and the effective voltage value $V_{rms}$ vary all the time depending on the conditions of a load or the like. For this reason, the power value may be obtained accurately by actually obtaining the instantaneous values V(t) in the above way.

In particular, the rising edges and falling edges of the output signals $S_1$, $S_2$ outputted from the inverters $INV_1$, $INV_2$ (see FIG. 8) and the third output signals $S_3$ obtained by synthesizing them are clearer than those of the emitter voltages $V_e$ of the photocouplers 41, 42. Accordingly, the lengths X, $X_0$ of the periods may be accurately obtained. This leads to an improvement in accuracy of calculation of the instantaneous values V(t) using the formula (2) or the formula (4).

Here, since both the first photocoupler 41 and the second photocoupler 42 are semiconductor elements, the first threshold $V_1$ and the second threshold $V_2$ set therein vary along with a change in the ambient temperature.

Figure 11:
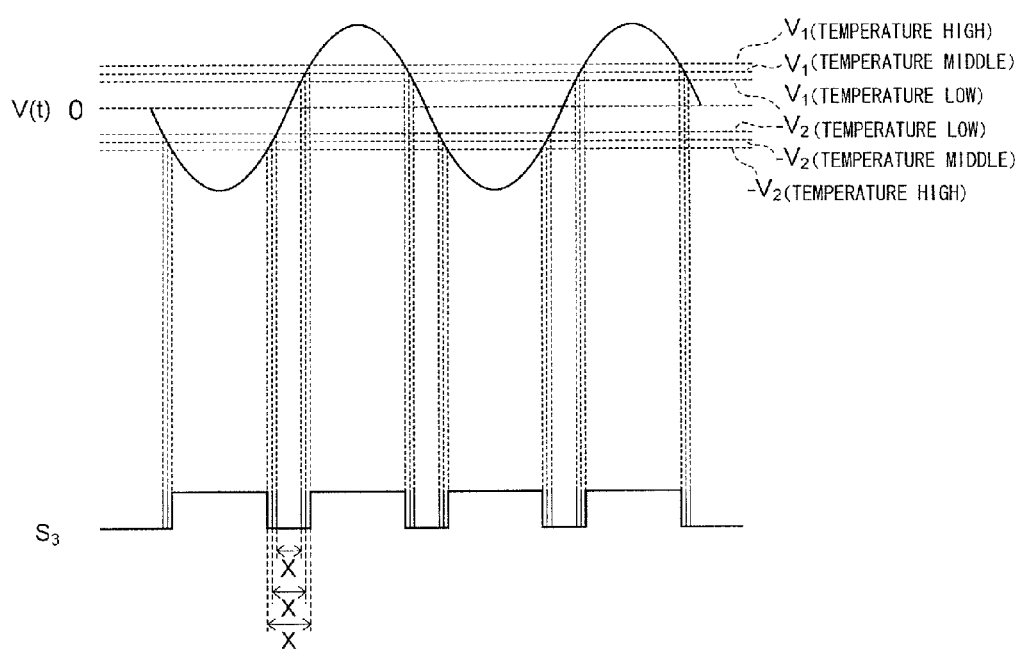
FIG. 11 is a timing chart of the composite signal of the first output signal and the second output signal and the instantaneous values of the power supply voltage in the case where a first threshold and a second threshold vary.

FIG. 11 is a timing chart of the instantaneous values V(t) and the composite signal $S_3$ in the case where the first threshold $V_1$ and the second threshold $V_2$ vary.

As illustrated in FIG. 11, the absolute values of the thresholds $V_1$, $V_2$ become larger as the ambient temperature rises. The length X of the period when the composite signal $S_3$ is at the low level varies along with the variations of the threshold $V_1$, $V_2$.

In this case, the reliability of the effective voltage value $V_{rms}$ obtained from the formula (1) and the instantaneous values V(t) obtained from the formula (2) by using such length X is lowered.

To address this, in this embodiment, the constant a in the formula (1) is corrected as in the following formula (5) using a temperature Y measured by the temperature measuring unit 60:
[Formula 5]

$$a=cY+d \quad (5).$$

In the formula (5), c and d are constants experimentally determined in advance.

By substituting the formula (5) into the formula (1), the following formula (6) is obtained:
[Formula 6]

$$V_{rms}=cYX+dX+b \quad (6).$$

By using this formula (6), the effective voltage value $V_{rms}$ with the ambient temperature Y taken into account may be calculated. Moreover, by substituting this formula (6) into the formula (2), the following formula (7) is obtained:
[Formula 7]

$$V(t)=\sqrt{2}(cYX+dX+b)\sin(\omega t) \quad (7).$$

By using this formula (7), the instantaneous values V(t) with the ambient temperature Y taken into account may be calculated.

Here, in the case where the effective voltage value $V_{rms}$ is estimated by using the formula (3), α in the formula (3) may be corrected for the same reason as in the formula (5) by using the following formula (8):

[Formula 8]

$$\alpha=\gamma Y+\delta \quad (8).$$

Here, in the formula (8), γ and δ are constants experimentally determined in advance.

Then, by substituting the formula (8) into the formula (3), the effective voltage value $V_{rms}$ with the ambient temperature Y taken into account may be calculated as in the following formula (9):
[Formula 9]

$$V_{rms}=\gamma Y X_0+\delta X_0+\beta \quad (9).$$

Moreover, by substituting this formula (9) into the formula (4), the following formula (10) is obtained:
[Formula 10]

$$V(t)=\sqrt{2}(\gamma Y X_0+\delta X_0+\beta)\sin(\omega t) \quad (10).$$

By using this formula (10), the instantaneous values V(t) with the ambient temperature Y taken into account may be calculated.

Next, a power measurement method according to this embodiment is described.

Figure 12:
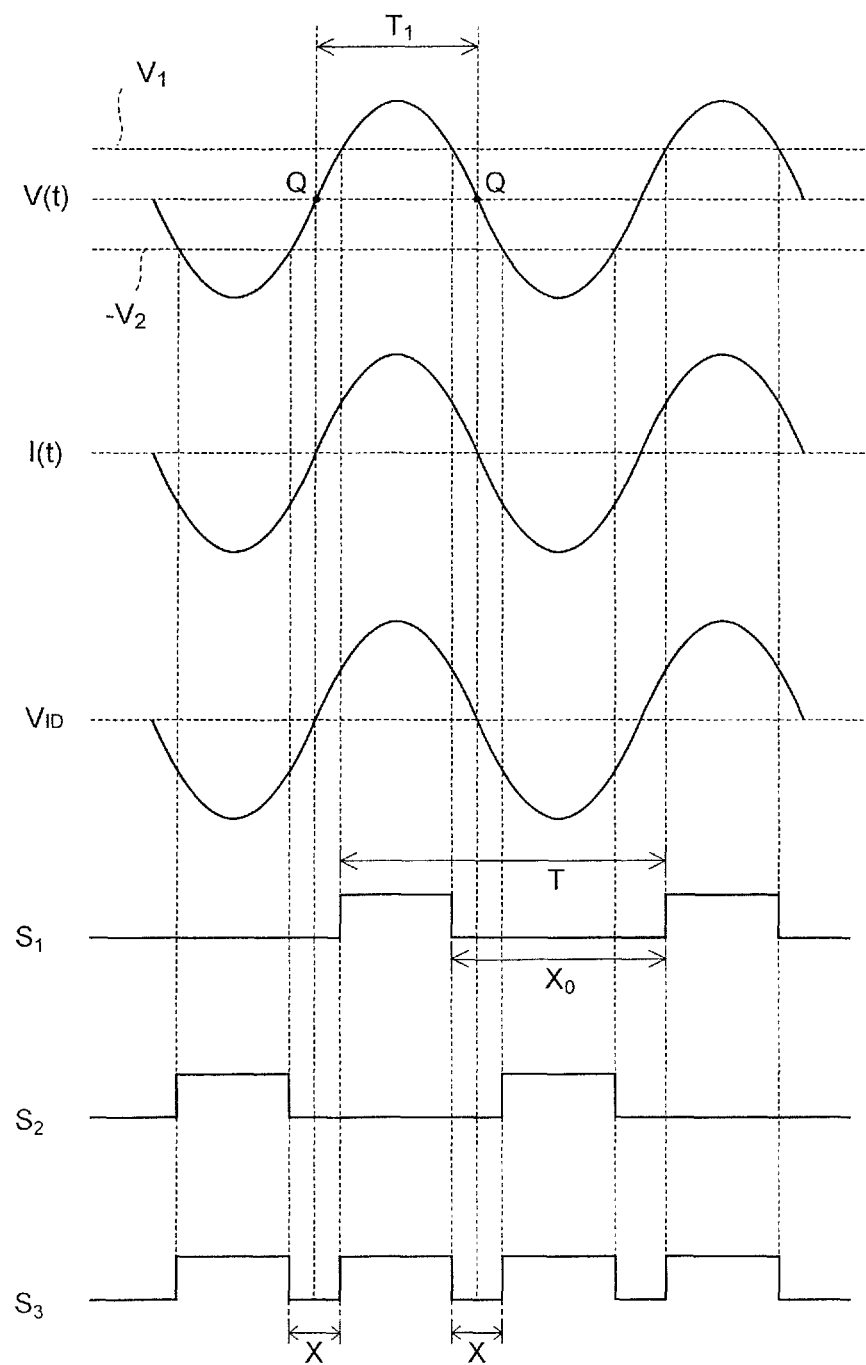
FIG. 12 is a timing chart of the instantaneous values of the power supply voltage and instantaneous values of a current.

FIG. 12 is a timing chart of the instantaneous values V(t) of the power supply voltage and instantaneous values I(t) of a current which are targeted for power measurement.

It should be noted that, although FIG. 12 illustrates a case where the instantaneous values V(t), I(t) of the voltage and the current are in phase, the instantaneous values V(t), I(t) may be out of phase depending on a type of load.

In addition, the digital current signal $V_{ID}$ outputted from each hall element 22 is also presented in this timing chart. The digital current signal $V_{ID}$ corresponds to the measured values of the instantaneous values I(t) of the current, and is synchronous with the instantaneous values I(t).

Further, the aforementioned signals $S_1$ to $S_3$ are also presented in this timing chart.

FIGS. 13 to 16 are flowcharts for explaining the power measurement method according to this embodiment. Steps in these flowcharts are executed by the computing unit 33 unless otherwise specified.

The computing unit 33 performs temperature measurement (FIG. 13), current measurement (FIG. 14), voltage measurement (FIG. 15) and power measurement (FIG. 16) in the following ways.

Figure 13:
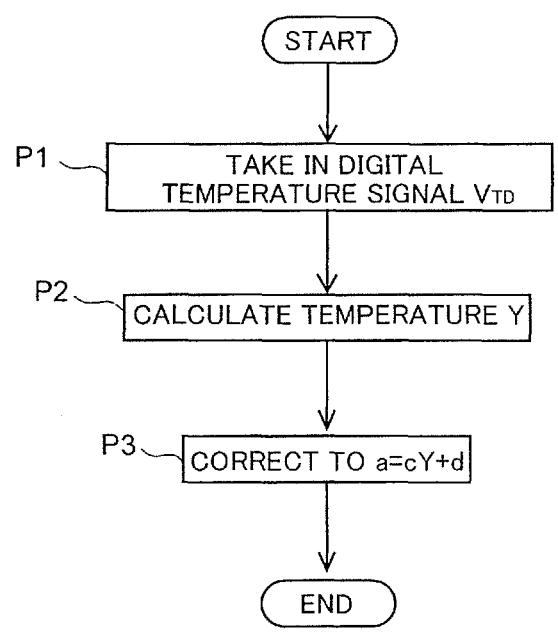
FIG. 13 is a flowchart for explaining temperature measurement in the first embodiment.

In first step P1 in FIG. 13, the computing unit 33 takes in a digital temperature signal $V_{TD}$ at predetermined sampling frequency F.

The sampling frequency F is not particularly limited. In this embodiment, the computing unit 33 identifies a cycle T (see FIG. 12) of the first output signal $S_1$, evenly divides the cycle T by 64, and thus employs 64/T as the sampling frequency F.

Then, the computing unit 33 proceeds to step P2, and calculates the temperature Y based on the digital temperature signal $V_{TD}$. This step may be executed in such a way that: a table of the digital temperature signal $V_{TD}$ and the temperature Y is prepared in advance; and the computing unit 33 obtains the temperature Y corresponding to the digital temperature signal $V_{TD}$ by referring to the table.

Next, the computing unit 33 proceeds to step P3, and corrects the constant a to a=cY+d by using the foregoing formula (5).

It should be noted that the formula (5) is a formula for correction to calculate the effective voltage value $V_{rms}$ by using the formula (1) as described above. When the effective voltage value $V_{rms}$ is calculated by using the formula (3) instead of the formula (1), the computing unit 33 may correct α to α=γY+δ as in the formula (8).

The temperature measurement is completed in the above way.

Figure 14:
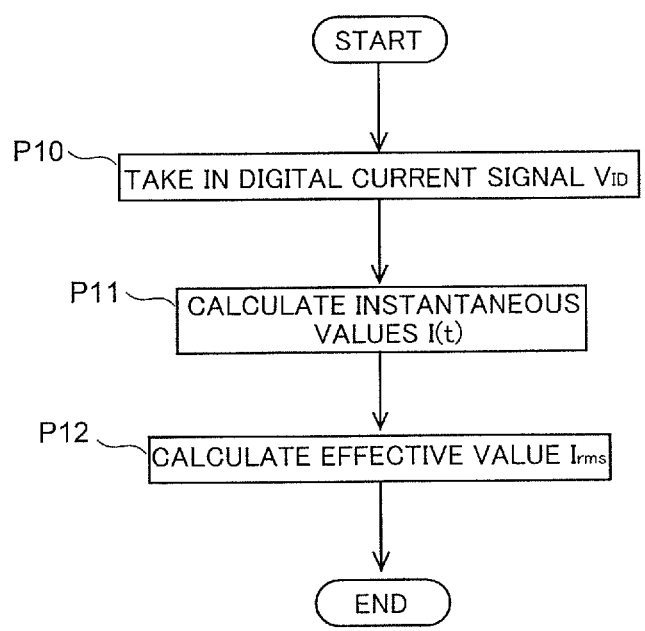
FIG. 14 is a flowchart for explaining current measurement in the first embodiment.

Next, the current measurement is described by referring to FIG. 14.

In first step P10, the computing unit 33 takes in the foregoing digital current signal $V_{ID}$ at the aforementioned sampling frequency F (=64/T).

Next, the computing unit 33 proceeds to step P11, and calculates the instantaneous values I(t) of a current I for each of the plurality of jack portions 1a on the basis of the digital current signal $V_{ID}$.

This step may be executed by reading the instantaneous value I(t) corresponding to the digital current signal $V_{ID}$ at each sampling time point in reference to a table of the digital current signal $V_{ID}$ and the instantaneous values I(t) which is prepared in advance.

Subsequently, the computing unit 33 proceeds to step P12, and calculates an effective value $I_{rms}$ of the current I for each of the plurality of jack portions 1a. The maximum value of the instantaneous values I(t) calculated in step P11 is determined as a current peak value $I_m$ and then the effective value $I_{rms}$ is calculated by using the following formula (11):

[Formula 11]

$$I_{rms} = \frac{I_m}{\sqrt{2}}. \tag{11}$$

The current measurement is completed in the above way.

Figure 15:
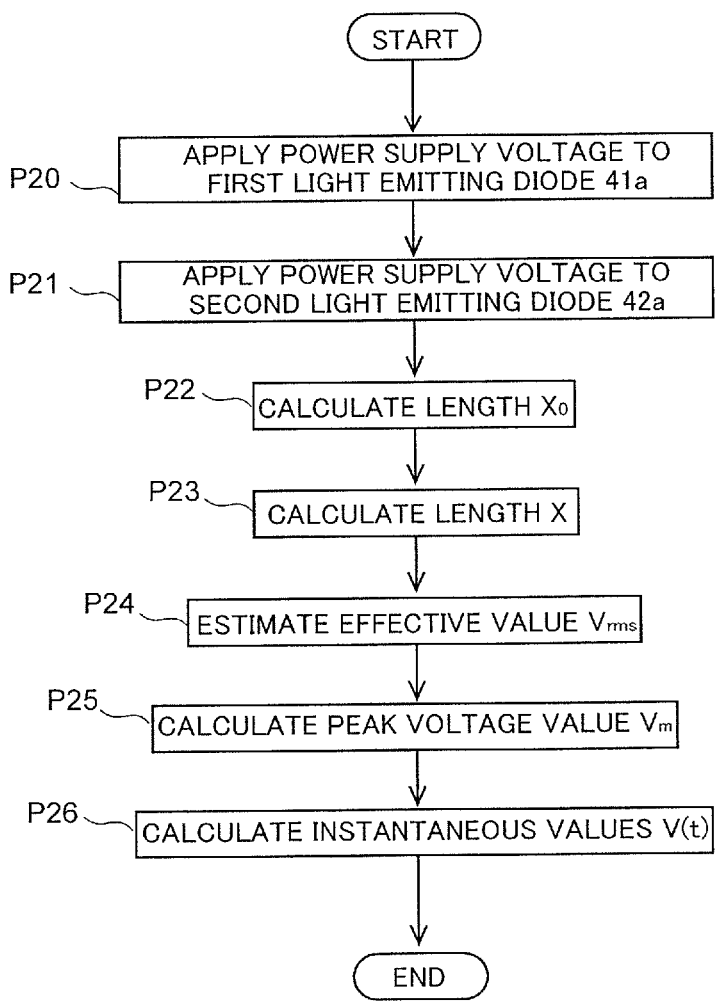
FIG. 15 is a flowchart for explaining voltage measurement in the first embodiment.

Next, the voltage measurement is described by referring to FIG. 15.

Firstly, in step P20, the power strip 1 starts to be used. This causes the power supply voltage to be applied to both ends of the first light emitting diode 41a (see FIG. 8).

At the same time, the power supply voltage is also applied to both ends of the second light emitting diode 41b in step P21.

Next, the computing unit 33 proceeds to step P22, and calculates the length $X_0$ (see FIG. 12) of the period when the first output signal $S_1$ is at the low level.

Then, the computing unit 33 proceeds to step P23, and calculates the length X (see FIG. 12) of the period when the composite signal $S_3$ is at the low level To calculate the length X, the computing unit 33 does not have to use the composite signal $S_3$. For example, the computing unit 33 may calculate, as the length X, a time interval between a rising edge of the first output signal $S_1$ and a falling edge of the second output signal $S_2$.

Subsequently, the computing unit 33 proceeds to step P24, and estimates the effective voltage value $V_{rms}$.

The effective voltage value $V_{rms}$ can be estimated as $V_{rms}$=aX+b from the formula (1) using the length X of the period obtained in step P23. Instead, the effective voltage value $V_{rms}$ may be estimated as $V_{rms}=\alpha X_0+\beta$ from the formula (3) using the length $X_0$ of the period obtained in step P22.

Next, the computing unit 33 proceeds to step P25, and estimates the instantaneous values V(t) of the power supply voltage.

The estimation of the instantaneous values V(t) uses the effective voltage value $V_{rms}$ calculated in step P24.

For example, when the effective voltage value $V_{rms}$ is calculated as $V_{rms}$=aX+b from the formula (1) in step P24, the instantaneous values V(t) may be estimated as V(t)= $\sqrt{2}$(aX+b)sin(ωt) using the formula (2).

On the other hand, when the effective voltage value $V_{rms}$ is calculated as $V_{rms}=\alpha X+\beta$ from the formula (3) in step P24, the instantaneous values V(t) may be estimated as V(t)= $\sqrt{2}(\alpha X_0+\beta)$sin(ωt) using the formula (4).

In either of the cases, the sampling frequency of the instantaneous values V(t) is set to be the same frequency as the sampling frequency F used to calculate the instantaneous value I(t) of the current I in step P11 (see FIG. 14). In addition, the same sampling points are used for the instantaneous values V(t) and the instantaneous values I(t).

The voltage measurement is completed in the above way.

Figure 16:
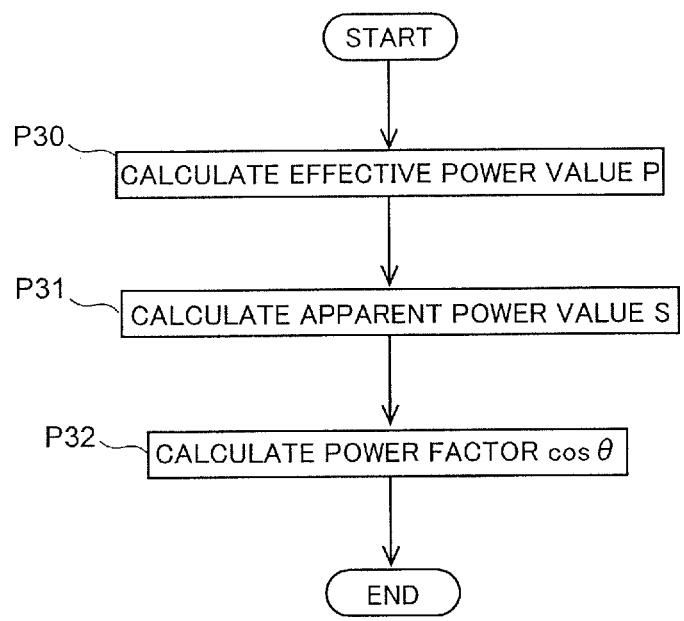
FIG. 16 is a flowchart for explaining power measurement in the first embodiment.

Next, the power measurement is described by referring to FIG. 16.

Firstly, in first step P30, the computing unit 33 calculates an effective power value P for each jack portion 1a on the basis of the following formula (12):

[Formula 12]

$$P = \frac{1}{T}\int_0^T V(t)I(t)dt. \tag{12}$$

In the formula (12), I(t) is the current instantaneous values obtained in step P11 (see FIG. 14), and V(t) is the voltage instantaneous values obtained in step P26 (see FIG. 15). Then, the values of the instantaneous values I(t), V(t) at the same sampling points are used as the integrand in the formula (12).

For calculating the products of the instantaneous values I(t), V(t) at the same sampling points, it is preferable that the computing unit 33 calculate a zero-cross point of the instantaneous values V(t) in advance.

As illustrated in FIG. 12, when the absolute values of the thresholds $V_1$, $V_2$ are set to an equal value, a zero-cross point Q may be obtained as a middle point of the length X of the period when the both the output signals $S_1$, $S_2$ are at the low level.

Then, if sampling of the instantaneous values I(t), V(t) is started from the zero-cross point Q and performed at the same sampling frequency F, the instantaneous values I(t), V(t) at the same sampling points may be obtained.

It should be noted that, if the zero-cross point Q is obtained as described above, the computing unit 33 may calculate a time interval $T_1$ between consecutive zero-cross points Q, and obtain twice the time interval $T_1$ as the cycle T. If this calculation is employed, the cycle T may be accurately obtained even when the waveform of the instantaneous values V(t) is unstable due to instability of a load. Accordingly, the accuracy of the sampling frequency F (=64/T) obtained from the cycle T is increased.

If a load connected to a jack portion 1a is of an AC-DC power supply, in particular, the waveform of the instantaneous values V(t) tends to be unstable. For this reason, it is practically beneficial to obtain the cycle T from the zero-cross points Q as described above.

Next, the computing unit 33 proceeds to step P31, and calculates an apparent power value S for each jack portion 1a based on the following formula (13):

[Formula 13]

$$S=V_{rms} \cdot I_{rms} \tag{13}.$$

In the formula (13), $I_{rms}$ is the effective value $I_{rms}$ of the current obtained in step P12 (see FIG. 14), and $V_{rms}$ is the effective voltage value $V_{rms}$ obtained in step P24 (FIG. 15).

Next, the computing unit 33 proceeds to step P32, and calculates a power factor cos θ for each jack portion 1a based on the following formula (14) using the effective power value P and the apparent power value S calculated in the above:

[Formula 14]

$$\cos\theta = \frac{P}{S}. \quad (14)$$

In the formula (14), θ is a phase difference between the effective values V(t), I(t) of the voltage and the current.

The power measurement is completed in the above way.

After performing all the steps in FIGS. 13 to 16, the computing unit 33 outputs output data $S_{out}$ to the output port 34 (see FIG. 8). The output data $S_{out}$ includes the effective power value P, the apparent power value S and the power factor cos θ.

The standard that the output data $S_{out}$ follows is not particularly limited. The output data $S_{out}$ may be formatted in conformity with any of the USB (Universal Serial Bus) standard, wired LAN (Local Area Network) and wireless LAN.

Moreover, it is preferable that the output data $S_{out}$ also include the instantaneous values I(t) of the current, the effective current value $I_{rms}$, the instantaneous values V(t) of the power supply voltage, the effective voltage value $V_{rms}$, and the like.

Note that, in addition to performing the above power measurement, the computing unit 33 may judge whether or not the power supply voltage is stable in the following way.

Figure 17:
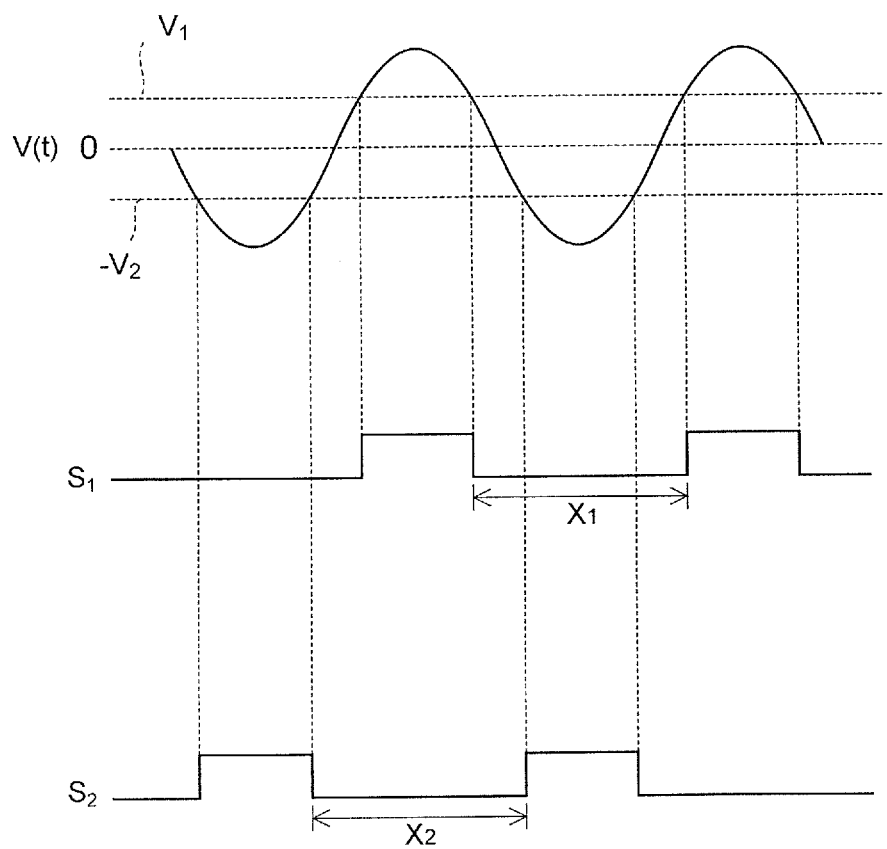
FIG. 17 is a timing chart of the first output signal and the second output signal in the case where the instantaneous values of the power supply voltage are in a stable sine wave.

FIG. 17 is a timing chart of the first output signal $S_1$ and the second output signal $S_2$ in the case where the instantaneous values V(t) of the power supply voltage are in a stable sine wave.

In this case, if the absolute values of the first threshold $V_1$ and the second threshold $V_2$ are set to an equal value, the length $X_1$ of the period when the first output signal $S_1$ is at the low level and the length $X_2$ of the period when the second output signal $S_2$ is at the low level are equal to each other.

Figure 18:
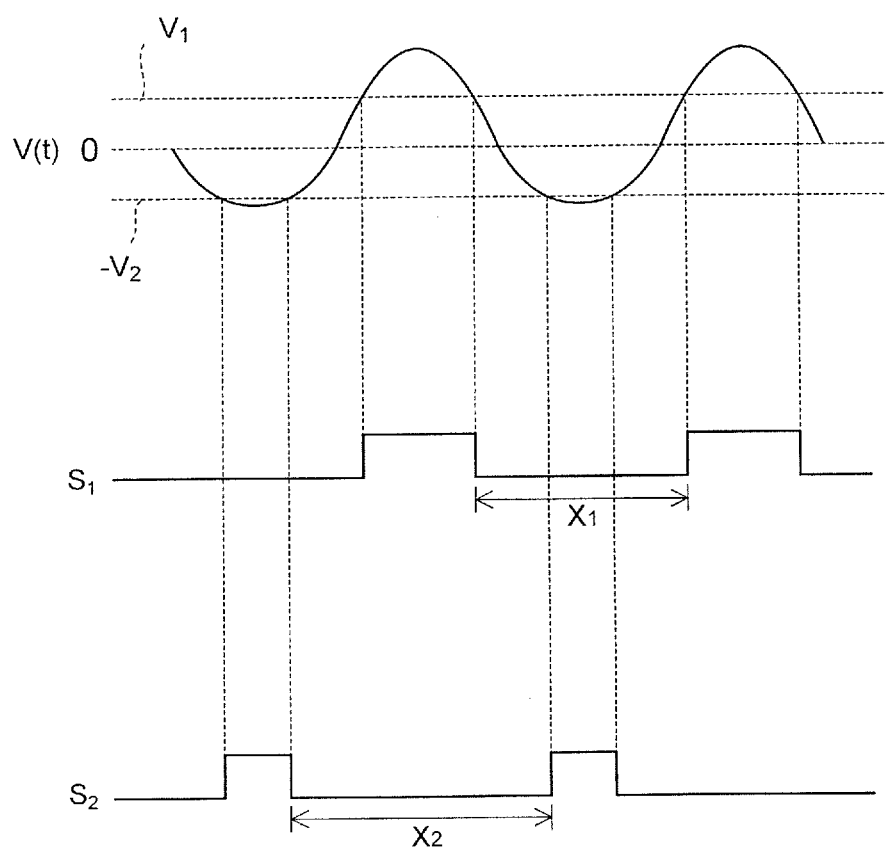
FIG. 18 is a timing chart of the first output signal and the second output signal in the case where the instantaneous values of the power supply voltage are unstable.

On the other hand, FIG. 18 is a timing chart of the first output signal $S_1$ and the second output signal $S_2$ in the case where the instantaneous values V(t) of the power supply voltage are unstable.

This example illustrates a case where the negative peak voltage of the instantaneous values V(t) of the power supply voltage is lower than the positive peak voltage thereof.

In this case, if the absolute values of the first threshold $V_1$ and the second threshold $V_2$ are set to an equal value, the length $X_2$ is longer than the length $X_1$.

As in FIGS. 17 and 18, the lengths $X_1$, $X_2$ may be used as indications for judging whether the instantaneous values V(t) are stable or not. By use of this, the computing unit 33 may judge the stability of the power supply voltage in the following way.

Figure 19:
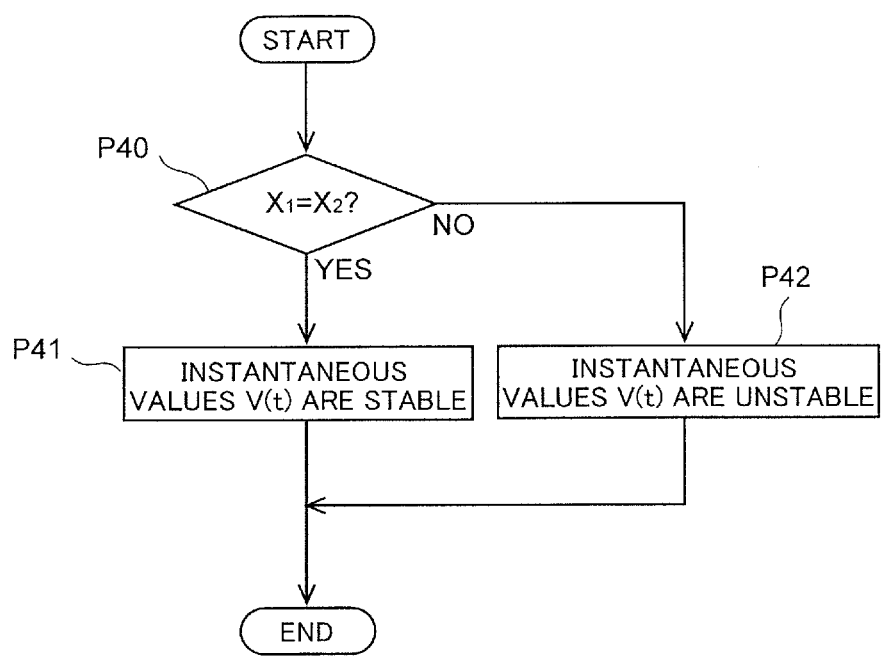
FIG. 19 is a flowchart illustrating a procedure of judging whether the power supply voltage is stable or not.

FIG. 19 is a flowchart illustrating a procedure of judging whether the power supply voltage is stable or not.

In first step P40, the computing unit 33 judges whether or not the length $X_1$ of the period when the first output signal $S_1$ is at the low level and the length $X_2$ of the period when the second output signal $S_2$ is at the low level are equal to each other.

If the lengths $X_1$, $X_2$ are judged as equal (YES), the computing unit 33 proceeds to step P41, and judges the instantaneous values V(t) as being in a sine wave and being stable as illustrated in FIG. 17.

On the other hand, if the lengths $X_1$, $X_2$ are judged as unequal (NO), the computing unit 33 proceeds to step P42, and judges the instantaneous values V(t) as being unstable as illustrated in FIG. 18.

The basic steps for judging the stability of the power supply voltage is completed in the above way.

The judgment result is included in the output data $S_{out}$ and is transmitted to the output port 34 (see FIG. 8) by the computing unit 33.

Next, a power measurement system using this power strip 1 is described.

Figure 20:
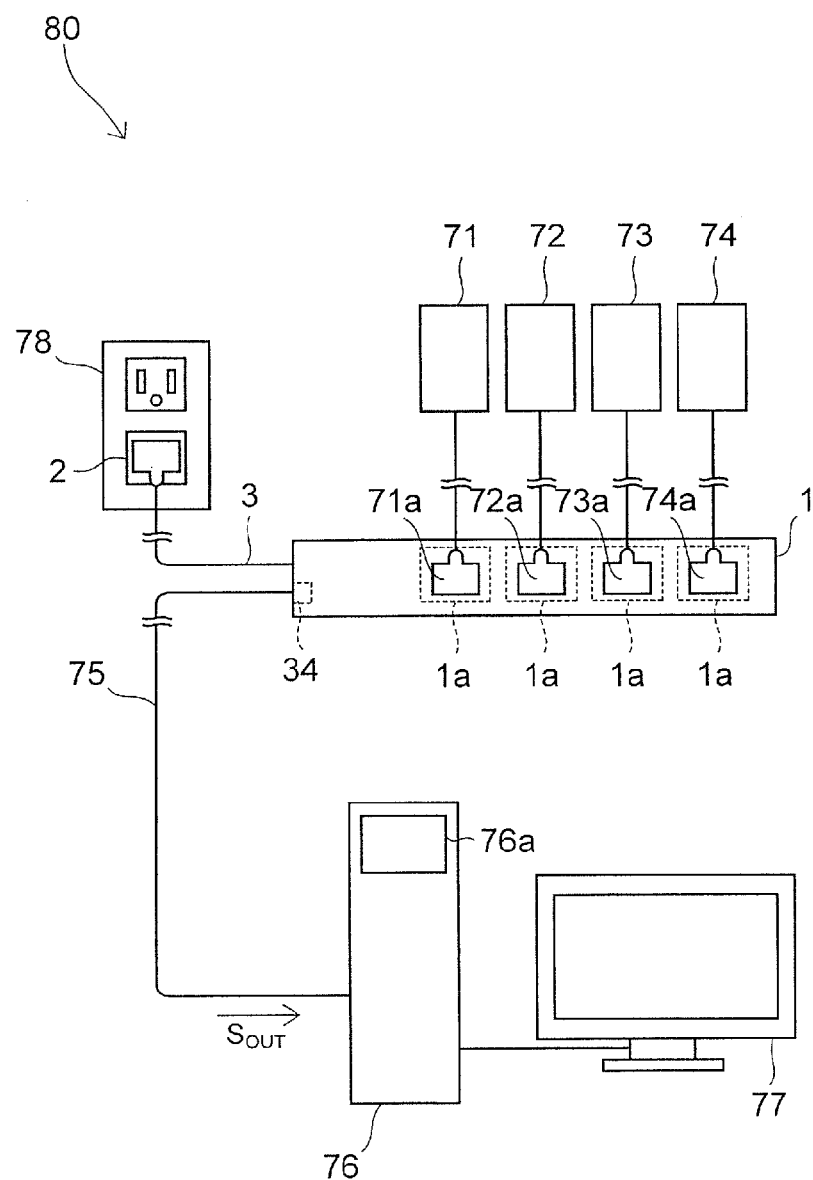
FIG. 20 is a schematic diagram for explaining a power measurement system according to the first embodiment.

FIG. 20 is a schematic diagram for explaining a power measurement system 80 according to this embodiment.

In order to use the power strip 1, the plug 2 is inserted into a wall outlet 78 as illustrated in FIG. 20.

Then, first to fourth plugs 71*a* to 74*a* of electrical devices 71 to 74 are inserted into the jack portions 1*a* of the power strip 1. Here, all the jack portions 1*a* do not have to be connected to the electrical devices, but some of the jack portions 1*a* may be unused.

In addition, an electronic computer 76 such as a personal computer and the output port 34 of the power strip 1 are connected together by a signal cable 75 such as a USB cable.

With this connection, the effective power values P, the apparent power values S, and the power factors cos θ of the respective electrical devices 71 to 74 are imported to the electronic computer 76 via the aforementioned output data $S_{out}$.

These effective power value P, apparent power value S, and power factor cos θ for each of the electrical devices 71 to 74 are displayed on a monitor 77.

By monitoring the monitor 77, a user may recognize in real time how much electric power is consumed in each of the electrical devices 71 to 74, and thereby may acquire information for deciding whether to reduce power consumption for each of the electrical devices 71 to 74 for energy saving.

For the sake of convenience of users, by use of the output data $S_{out}$, the instantaneous values V(t) and the effective voltage value $V_{rms}$ of the power supply voltage may be displayed, or the instantaneous values I(t) and the effective current value $I_{rms}$ of the current supplied from each of the jack portions 1*a* may be displayed on the monitor 77.

In addition, a database 76*a* may be provided in the electronic computer 76, and the total power consumption within a predetermined period by each of the electrical devices 71 to 74 may be stored in the database 76*a*. By use of this, the information for deciding whether to reduce power consumption may be further increased.

According to the embodiment described above, the power values of the electrical devices 71 to 74 connected to the power strip 1 may be individually monitored as described in reference to FIG. 20.

In addition, as described in reference to FIG. 8, the first photocoupler 41 and the second photocoupler 42 having high surge resistance are used to monitor the instantaneous values V(t) of the power supply voltage. Thus, there is a low risk that the voltage measuring unit 50 may be broken due to a surge.

Further, as described in reference to the formula (12), the instantaneous values V(t) of the power supply voltage and the instantaneous values I(t) of the current are used to calculate the effective power value P. With this calculation, the effective power value P reflects variations in the instantaneous values V(t), I(t) in actual use. Thus, the calculation accuracy of the effective power value P is improved in comparison with a case where the power value is calculated with the effective voltage value $V_{rms}$ fixed to 100V, for example.

Moreover, the instantaneous values V(t) of the power supply voltage are corrected as in the formula (7) or the formula (10) based on the temperature Y measured by the temperature measuring unit 60, whereby the effective power value P may be calculated correctly even when the ambient temperature Y of the power strip 1 changes.

Furthermore, as illustrated in FIG. 3, the instantaneous values I(t) of the current are measured by the hall element 22 that is smaller than other magnetic field measurement elements, whereby the power values may be calculated inside the power strip 1 without size-increase of the power strip 1.

(Second Embodiment)

Figure 21:
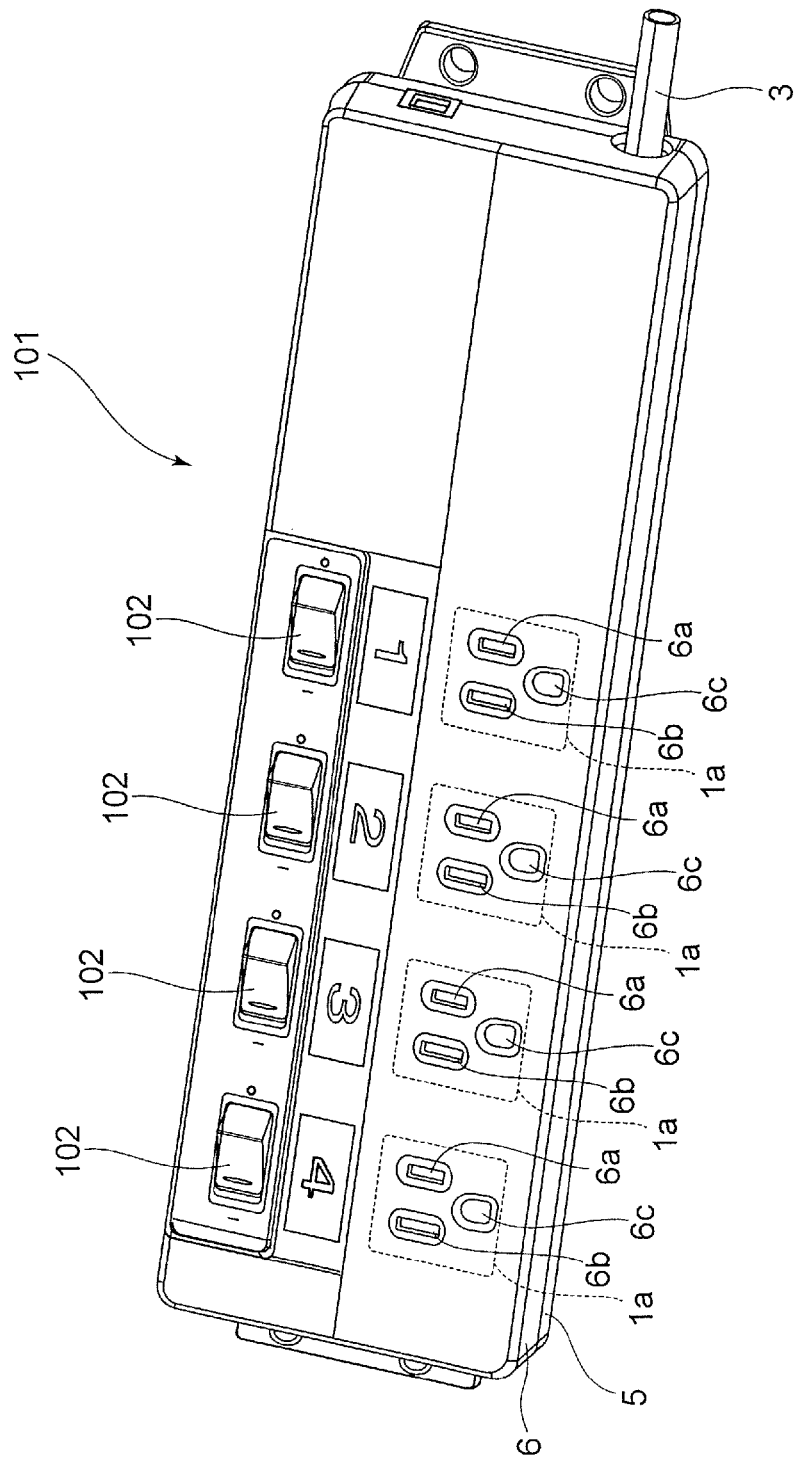
FIG. 21 is an external view of a power strip according to a second embodiment.

FIG. 21 is an external view of a power strip 101 according to this embodiment. In FIG. 21, elements having the same functions as those described in the first embodiment are given the same reference numerals as in the first embodiment, and the description thereof is omitted below.

As illustrated in FIG. 21, this power strip 101 is provided with switches 102 respectively corresponding to a plurality of jack portions 1a.

Figure 22:
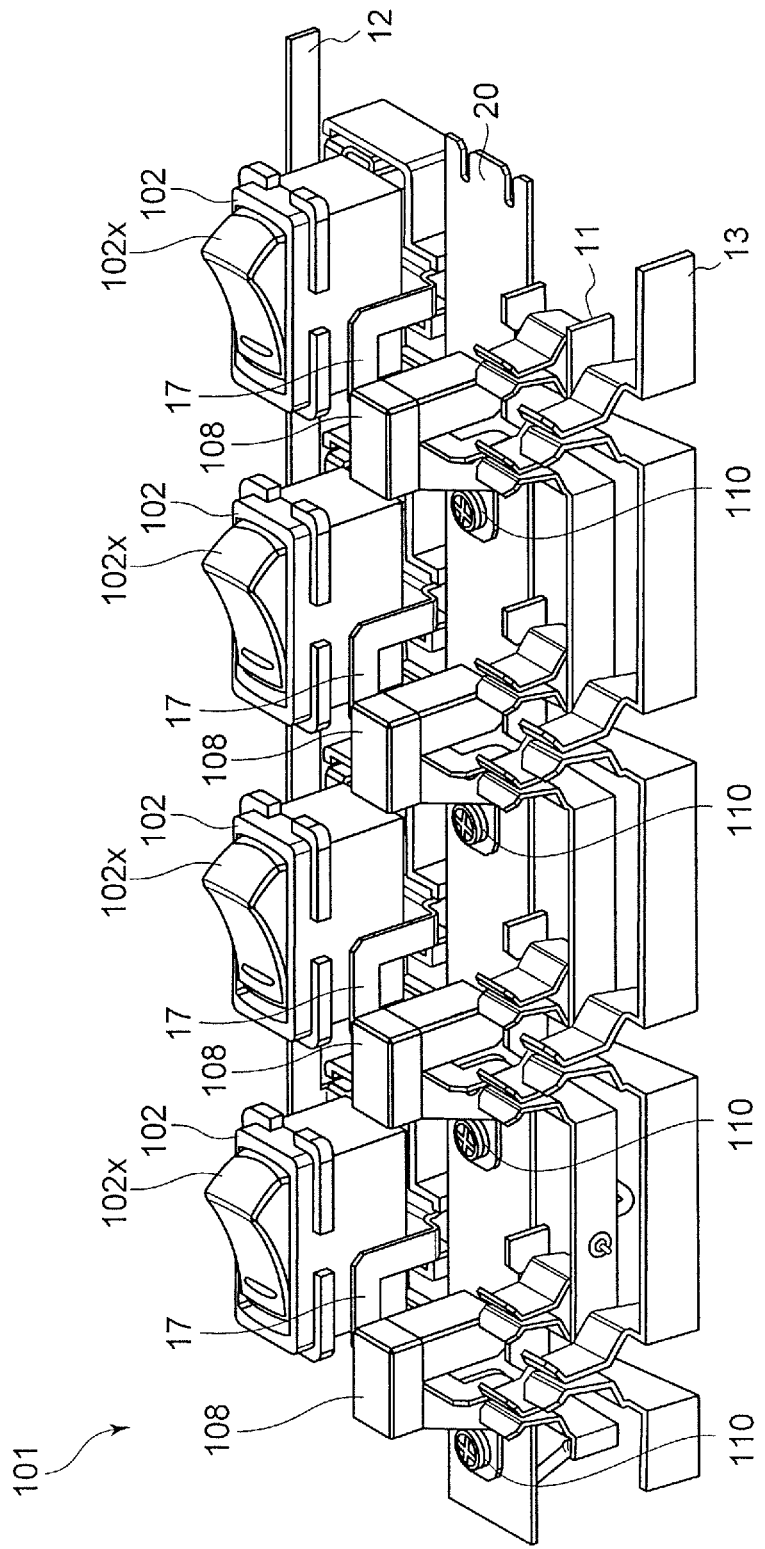
FIG. 22 is a perspective view of the power strip according to the second embodiment with a lower casing and an upper casing removed.

FIG. 22 is a perspective view of the power strip 101 with a lower casing 5 and an upper casing 6 removed.

Each switch 102 is a rocker switch. When a user presses down a button 102x on an ON side or OFF side, the switch 102 may electrically connect the corresponding branch bar 17 to a second bus bar 12 or electrically disconnect the branch bar 17 from the second bus bar 12.

Moreover, covers 108 for housing magnetic cores 21 (see FIG. 3) are fixed to a first circuit board 20 with screws 110.

Figure 23:
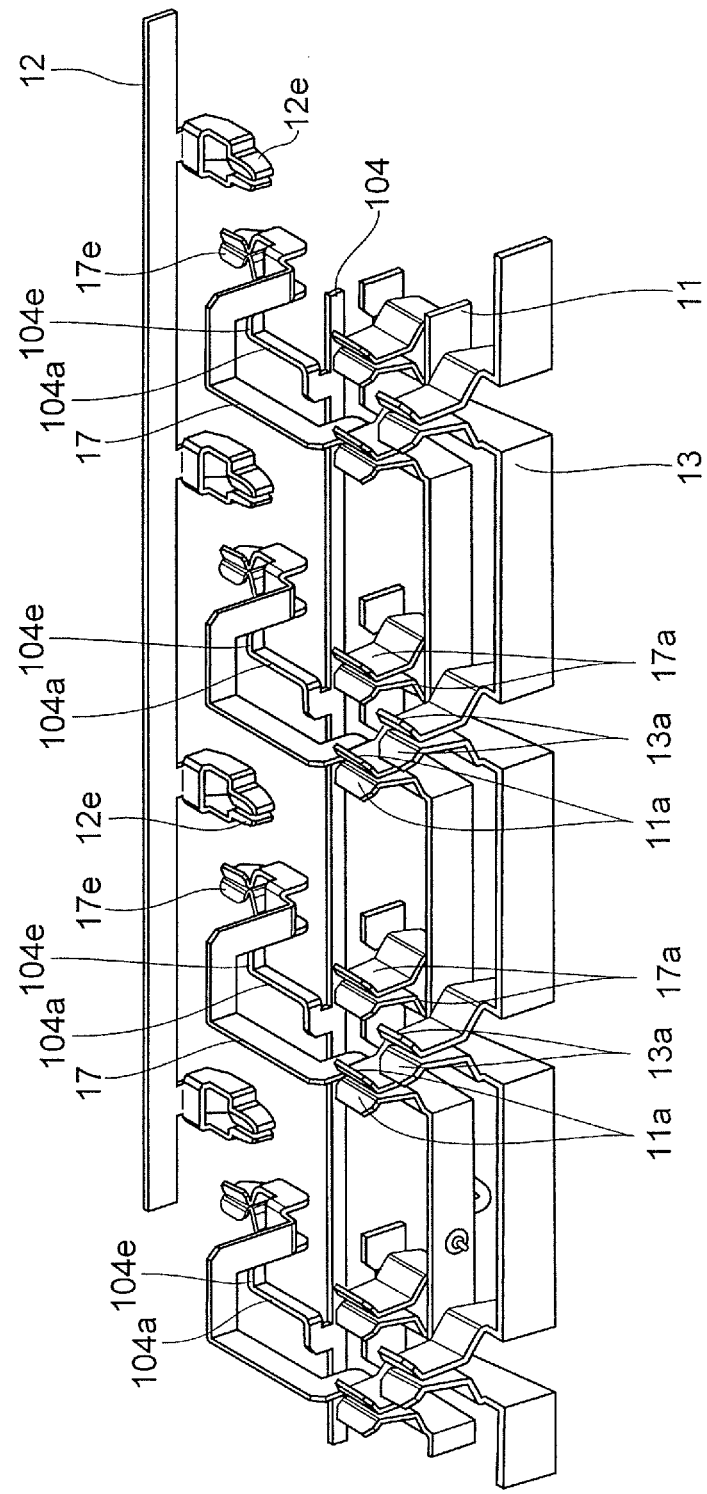
FIG. 23 is a perspective view of the configuration in FIG. 22 with a first circuit board, switches, and covers removed.

FIG. 23 is a perspective view of the configuration in FIG. 22 with the first circuit board 20, the switches 102, and the covers 108 removed.

In FIG. 23, elements having the same functions as those described in the first embodiment are given the same reference numerals as in the first embodiment, and the description thereof is omitted below.

As illustrated in FIG. 23, the second bus bar 12 is provided with fourth contacts 12e and tip ends of the branch bars 17 are provided with fifth contacts 17e in this embodiment.

Moreover, in addition to the first to third bus bars 11 to 13, an auxiliary bar 104 is provided to supply power to light sources such as LEDs included inside the respective switches 102.

The auxiliary bar 104 is fabricated by die-cutting a metal plate such as a brass plate and then bending it, and includes a plurality of branches 104a corresponding to the respective switches 102. In addition, at a tip end of each branch 104a, a sixth contact 104e is formed to bend in a direction perpendicular to an extending direction of the branch 104a.

Figure 24:
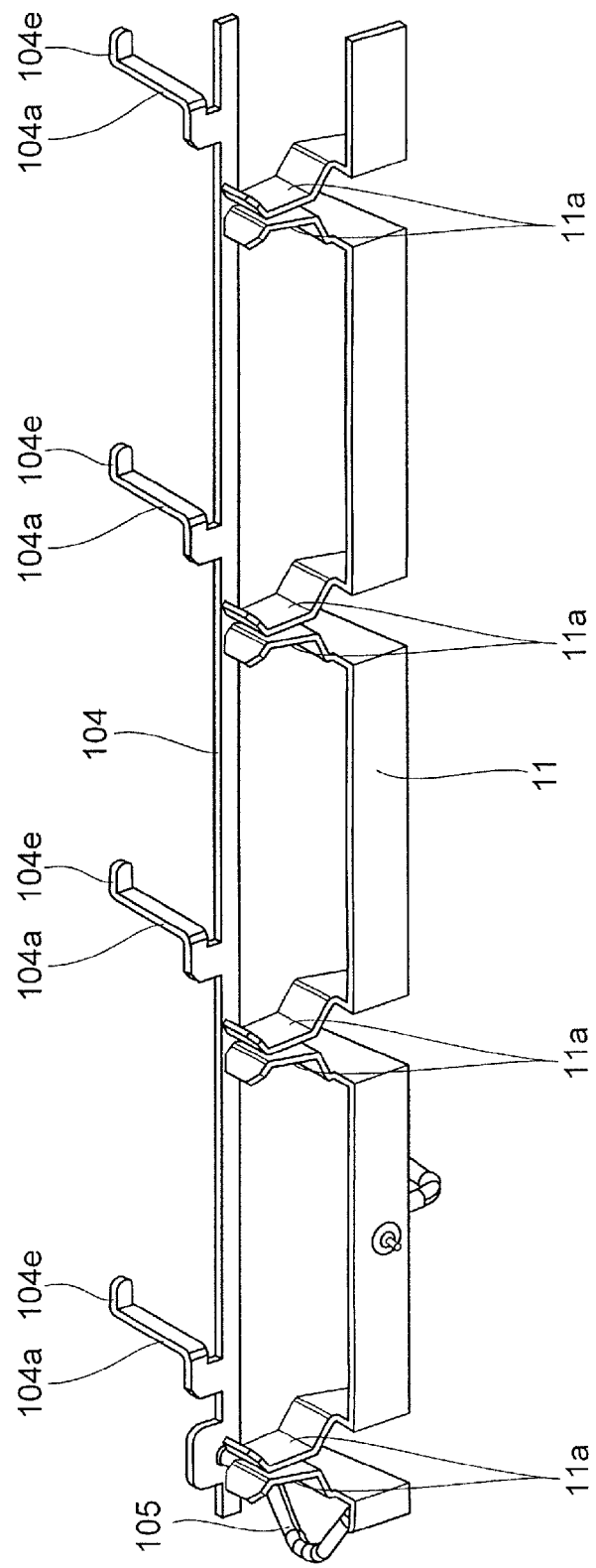
FIG. 24 is a perspective view of a first bus bar and an auxiliary bar according to the second embodiment.

FIG. 24 is a perspective view of the first bus bar 11 and the auxiliary bar 104.

As illustrated in FIG. 24, the first bus bar 11 and the auxiliary bar 104 are electrically connected to each other by a connection cable 105 and thereby are set to have an equal electrical potential.

Figure 25:
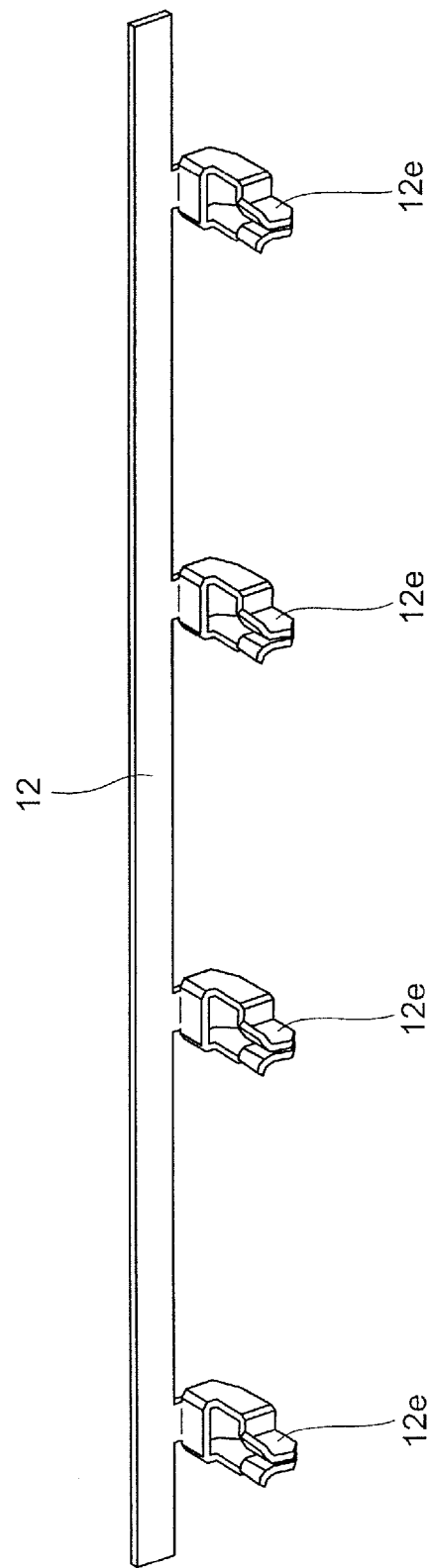
FIG. 25 is a perspective view of a second bus bar according to the second embodiment.
Figure 26:
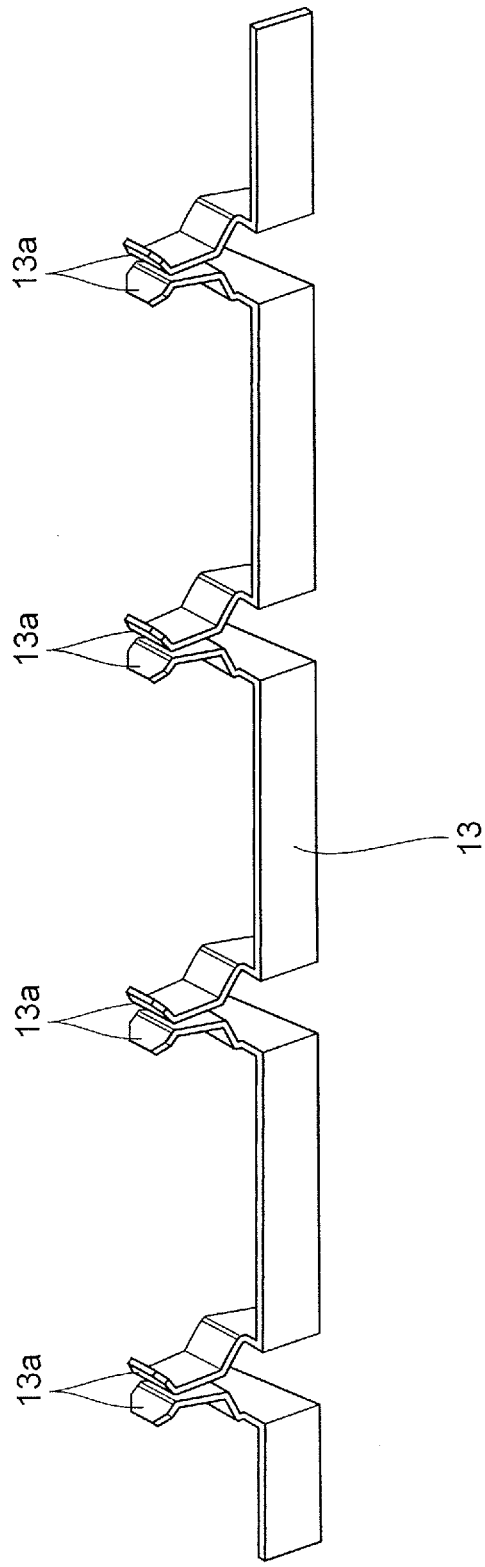
FIG. 26 is a perspective view of a third bus bar according to the second embodiment.

On the other hand, FIG. 25 is a perspective view of the second bus bar 12, and FIG. 26 is a perspective view of the third bus bar 13.

These bus bars 12, 13 are also each fabricated by die-cutting a metal plate such as a brass plate and then bending it.

Figure 27:
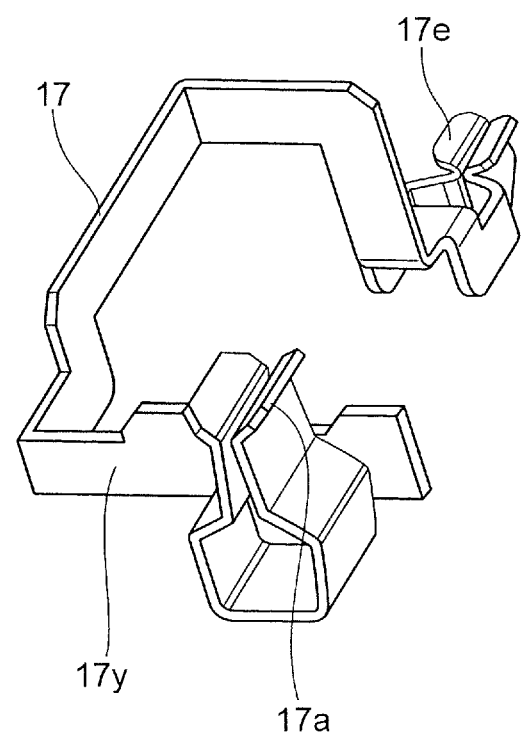
FIG. 27 is a perspective view of a branch bar according to the second embodiment.

In addition, FIG. 27 is a perspective view of the branch bar 17 according to this embodiment.

As illustrated in FIG. 27, an extending portion 17y of the second contact 17a is provided at an end portion of the branch bar 17.

Figure 28:
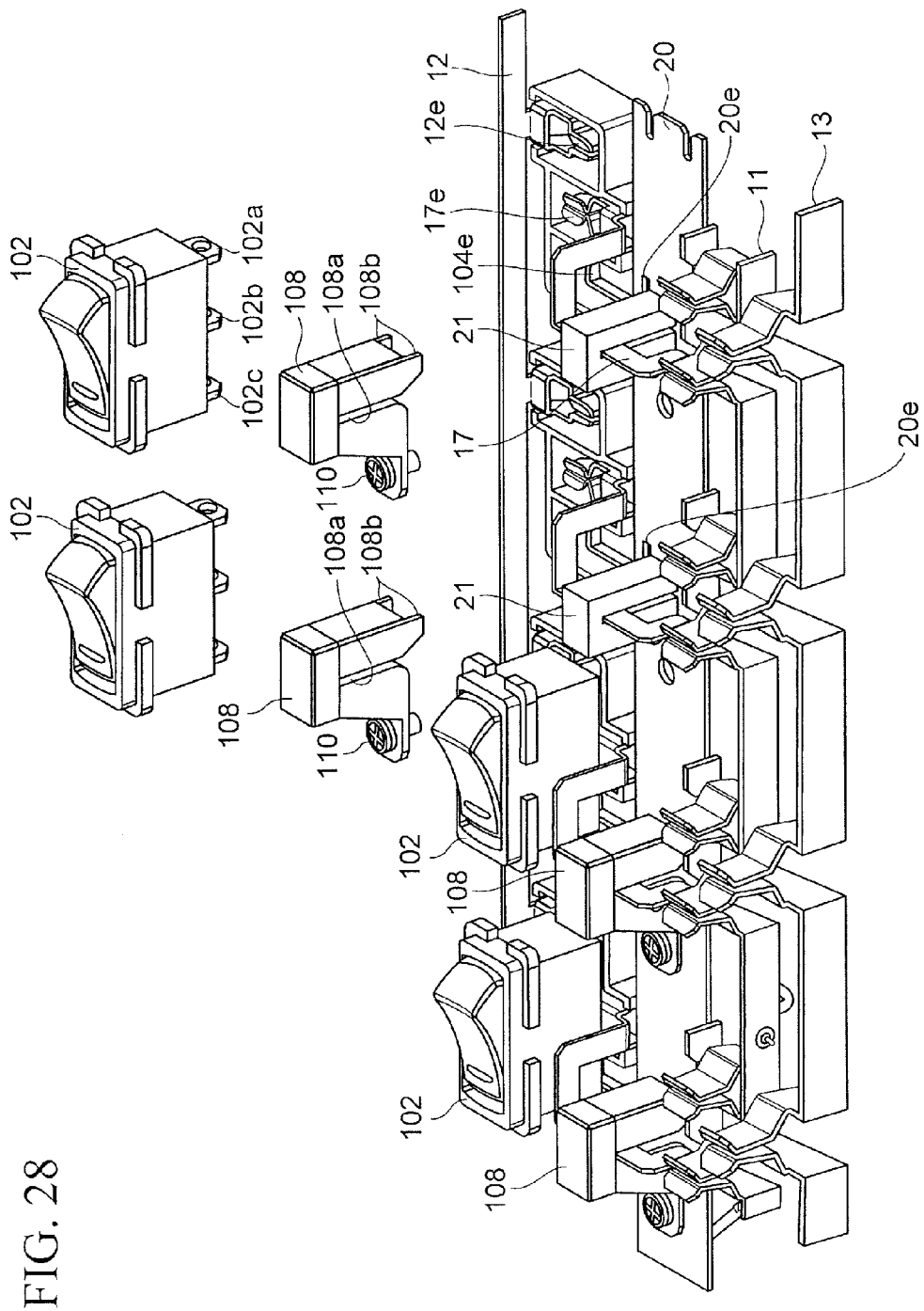
FIG. 28 is an exploded perspective view of a power strip according to the second embodiment.

FIG. 28 is an exploded perspective view of the power strip 101.

As illustrated in FIG. 28, each cover 108 has a size enough to house the magnetic core 21 therein and includes a slit 108a through which the branch bar 17 is inserted.

In addition, a bottom portion of the cover 108 is provided with two joint projections 108b. The joint projections 108b are fitted into joint holes 20e provided to the first circuit board 20, whereby the cover 108 and the first circuit board 20 are positioned.

The cover 108 is provided for each magnetic core 21, and is fixed to the first circuit board 20 with the screw 110 as described above. This fixation improves the stability of the magnetic core 21 on the first circuit board 20.

On the other hand, the switch 102 is provided with first to third terminals 102a to 102c. These terminals 102a to 102c are fitted to the fourth contact 12e, the fifth contact 17e, and the sixth contact 104e, respectively.

Figure 29:
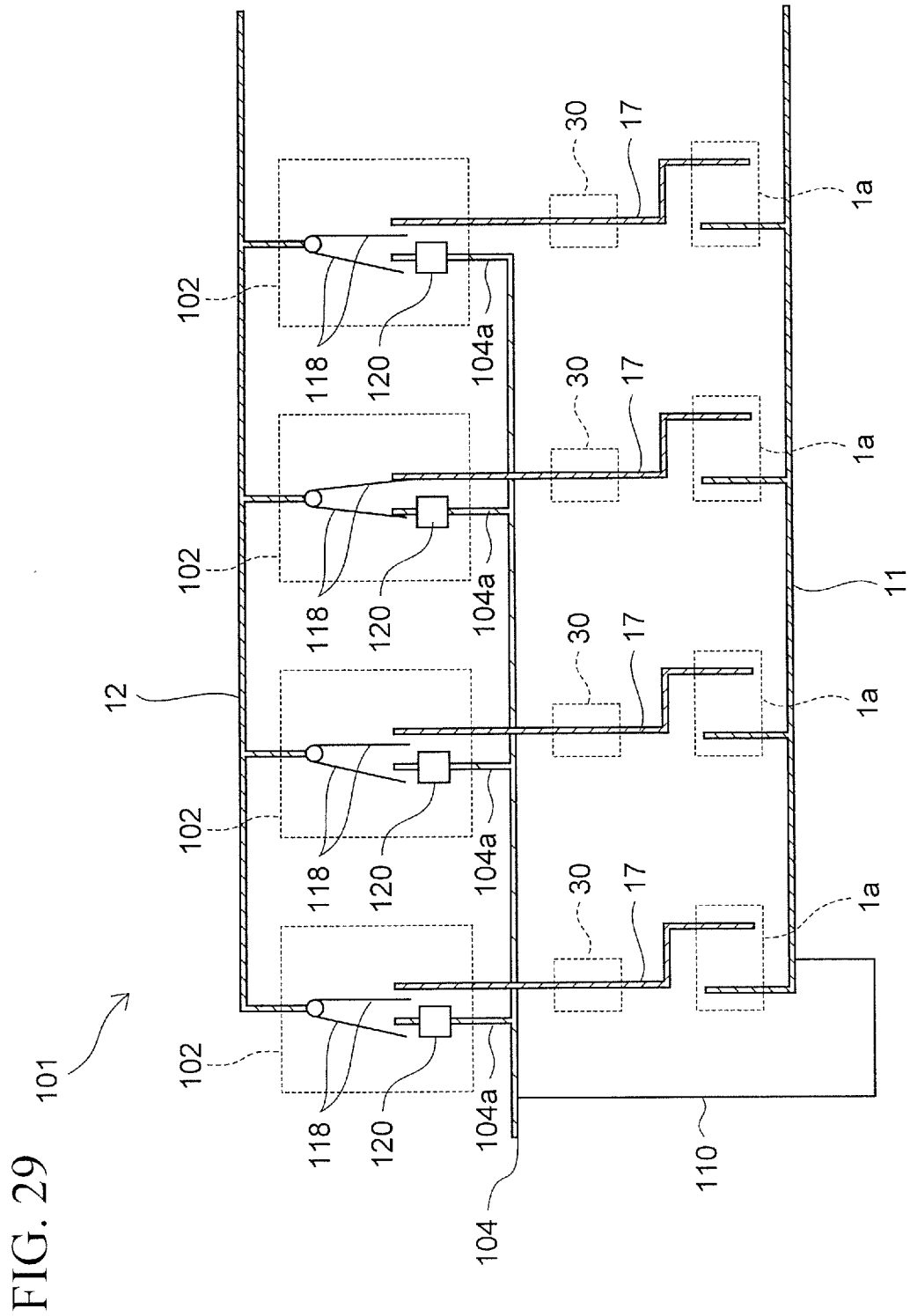
FIG. 29 is a circuit diagram of the power strip according to the second embodiment.

FIG. 29 is a circuit diagram of the power strip 101 including the switches 102. In FIG. 29, the third bus bar 13 serving as an earth line is omitted.

As illustrated in FIG. 29, each switch 102 includes a light source 120 and two conductive blades 118. These conductive blades 118 are mechanically connected to the button 102x (see FIG. 22). When the switch 102 is turned into the ON state by an operation of the button 102x, the branch bar 17 and the branch 104a are electrically connected to the second bus bar 12 at the same time.

When the switch 102 becomes in the ON state as described above, the light source 120 emits light to illuminate the whole of the translucent button 102x (see FIG. 22) with the light, and thereby a user may know that the switch 102 is in the ON state.

Here, the power strip 101 according to this embodiment includes a transmitter circuit section 27 having the same circuit configuration as in FIG. 8, and may be able to perform the same power measurement method as in the first embodiment.

According to the embodiment described above, the switch 102 is provided to each jack portion 1a as illustrated in FIG. 21. With this configuration, when an electrical device connected to a jack portion 1a is unused, the switch 102 corresponding to the jack portion 1a is turned off to cut off power supply to the electrical device from the jack portion 1a. In this way, the standby power consumption of the electrical device may be cut off.

Moreover, as illustrated in FIG. 28, the magnetic cores 21 are housed inside the covers 108 and the covers 108 are fixed to the first circuit board 20. Thereby, the magnetic cores 21 are less likely to be displaced on the first circuit board 20, and thereby the stability of attachment of the magnetic cores 21 to the first circuit board 20 is improved.

Although the embodiments are described in detail hereinabove, the embodiments are not limited to the above description.

For example, the above description is provided for the cases where the power strips 1, 101 are each provided with a plurality of jack portions 1a as illustrated in FIGS. 1 and 21, but one jack portion 1a may be provided to the power strip 1 or 101.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power strip comprising:
   a first power line;
   a second power line between which and the first power line a power supply voltage is applied;
   a jack portion;
   a current meter configured to measure a current being supplied to an external electric device from the jack portion;
   a first photocoupler including a first light emitting diode electrically connected between the first power line and the second power line, the first photocoupler configured to output a first output signal whose level is changed when the power supply voltage exceeds a first threshold;
   a second photocoupler including a second light emitting diode electrically connected between the first power line and the second power line with the polarity of the second light emitting diode reversed from the polarity of the first light emitting diode, the second photocoupler configured to output a second output signal whose level is changed when the power supply voltage exceeds a second threshold; and
   a computing unit configured to calculate a power value by using instantaneous values of the current measured by the current meter and instantaneous values of the power supply voltage estimated based on only a length of a period when both the first output signal and the second output signal are at a low level,
   wherein the computing unit calculates an effective voltage value $V_{rms}$ of the power supply voltage by using $V_{rms}=aX+b$ (a is a constant having a unit of voltage per time and determined in advance, and b is a constant having a unit of voltage and determined in advance) where X denotes the length of the period when both the first output signal and the second output signal are at the low level, and
   the computing unit estimates the instantaneous value of the power supply voltage at a time point t as $\sqrt{2}V_{rms}\sin(\omega t)$ ($\omega$ is a known angular frequency).

2. The power strip according to claim 1, the power strip further comprising:
   a temperature sensor configured to measure an ambient temperature of the first photocoupler and the second photocoupler,
   wherein the computing unit corrects the effective voltage value $V_{rms}$ of the power supply voltage on the basis of the ambient temperature.

3. The power strip according to claim 2, wherein the computing unit corrects the constant a by using $a=cY+d$ (c is a constant having a unit of voltage per (time×temperature) and determined in advance, and d is a constant having a unit of voltage per time and determined in advance) where Y denotes the temperature, and then corrects the effective voltage value $V_{rms}$ by using $V_{rms}=cYX+dX+b$.

4. The power strip according to claim 1, wherein the computing unit calculates as the power value an effective power value by integrating products of the instantaneous values of the power supply voltage and the instantaneous values of the current over time.

5. The power strip according to claim 4, wherein the computing unit calculates an apparent power value for each jack portion by multiplying an effective voltage value of the power supply voltage by an effective current value of the current, and calculates a power factor from a ratio of the effective power value to the apparent power value.

6. The power strip according to claim 4, wherein the computing unit calculates the effective power value by sampling the instantaneous values of the current at a predetermined sampling frequency; sampling the instantaneous values of the power supply voltage at the predetermined sampling frequency; and calculating products of the instantaneous values of the current and the instantaneous values of the power supply voltage at the same sampling points and integrating the products over time.

7. The power strip according to claim 6, wherein the computing unit determines the predetermined sampling frequency by evenly dividing a cycle of the first output signal.

8. The power strip according to claim 6, wherein
   absolute values of the first threshold and the second threshold are equal to each other, and
   the computing unit determines as a zero-cross point a middle point of the length of the period when both the first output signal and the second output signal are at the low level, and uses the zero-cross point as a start point of the sampling.

9. The power strip according to claim 1, wherein
   the first photocoupler includes a first photo transistor configured to receive light of the first light emitting diode,
   the second photocoupler includes a second photo transistor configured to receive light of the second light emitting diode, and
   the power strip further comprises:
   a first inverter configured to generate the first output signal by inverting an emitter voltage of the first photo transistor; and
   a second inverter configured to generate the second output signal by inverting an emitter voltage of the second photo transistor.

10. The power strip according to claim 1, the power strip further comprising:
    an output port electrically connected to the computing unit and configured to output output data including the power value to outside.

11. The power strip according to claim 10, wherein the output data includes the instantaneous values of the power supply voltage and the instantaneous values of the current.

12. The power strip according to claim 1, wherein
    the current meter includes:
    a bar through which the current flows;
    a magnetic core surrounding the bar while having a gap formed therein; and
    a hall element provided inside the gap and configured to measure the current.

13. The power strip according to claim 12, wherein a magnetic sensing plane of the hall element is parallel with an extending direction of the bar.

14. A power measurement method comprising:
    applying a power supply voltage supplied to a power strip to both ends of a first light emitting diode included in a first photocoupler;
    monitoring a first output signal of the first photocoupler, a level of the first output signal being changed when the power supply voltage exceeds a first threshold, and thereby obtaining a length of a period when the level of the first output signal is changed;
    applying the power supply voltage, whose polarity is reversed from polarity in the first light emitting diode, to both ends of a second light emitting diode included in a second photocoupler;
    monitoring a second output signal of the second photocoupler, a level of the second output signal being changed when the power supply voltage exceeds a second threshold, and thereby obtaining a length of a period when both the first output signal and the second output signal are at a low level;

estimating instantaneous values of the power supply voltage based on only the length of the period when both the first output signal and the second output signal are at the low level;

measuring instantaneous values of a current for each of a plurality of jack portions included in the power strip, the current being supplied to an external electrical device from the jack portion; and calculating a power value of each of the plurality of jack portions individually by using the instantaneous values of the power supply voltage and the instantaneous values of the current, wherein, in the estimating the instantaneous values of the power supply voltage, an effective voltage value $V_{rms}$ of the power supply voltage is calculated by using $V_{rms}=aX+b$ (a is a constant having a unit of voltage per time and determined in advance, and b is a constant having a unit of voltage and determined in advance) where X denotes the length of the period when both the first output signal and the second output signal are at the low level, and the instantaneous value of the power supply voltage at a time point t is estimated as $\sqrt{2}V_{rms}\sin(\omega$ is a known angular frequency).

15. The power measurement method according to claim 14, the method further comprising:

measuring an ambient temperature of the first photocoupler and the second photocoupler; and correcting the effective voltage value $V_{rms}$ of the power supply voltage on the basis of the ambient temperature.

16. The power measurement method according to claim 14, wherein absolute values of the first threshold and the second threshold are equal to each other, the method further comprises:

determining that the power supply voltage is stable when the length of a period when the first output signal is at the low level and the length of a period when the second output signal is at the low level are equal to each other; otherwise determining that the power supply voltage is unstable.

* * * * *